United States Patent
Pyeon

(10) Patent No.: US 8,913,443 B2
(45) Date of Patent: Dec. 16, 2014

(54) VOLTAGE REGULATION FOR 3D PACKAGES AND METHOD OF MANUFACTURING SAME

(75) Inventor: Hong Boem Pyeon, Ottawa (CA)

(73) Assignee: Conversant Intellectual Property Management Inc., Ottawa (CA)

(*) Notice: Subject to any disclaimer, the term of this patent is extended or adjusted under 35 U.S.C. 154(b) by 644 days.

(21) Appl. No.: 13/236,381

(22) Filed: Sep. 19, 2011

(65) Prior Publication Data

US 2013/0070540 A1 Mar. 21, 2013

(51) Int. Cl.
- G11C 5/14 (2006.01)
- H01L 25/065 (2006.01)
- G11C 11/4074 (2006.01)
- H01L 25/18 (2006.01)

(52) U.S. Cl.
CPC ............. H01L 25/0657 (2013.01); *H01L 25/18* (2013.01); G11C 11/4074 (2013.01); *H01L 2225/06513* (2013.01); G11C 5/147 (2013.01); *H01L 2224/16* (2013.01); *H01L 2225/06541* (2013.01)
USPC ............ 365/189.09; 365/189.07; 365/189.11; 365/230.06; 365/230.08

(58) Field of Classification Search
CPC ........ H01L 23/50; G11C 5/147; G11C 16/10; G11C 11/4074; G11C 5/14; G11C 11/4096; G11C 16/12; G11C 16/30; G11C 5/145
USPC .................. 365/189.07, 189.03, 189.08, 226, 365/189.09, 189.11, 230.06, 230.08
See application file for complete search history.

(56) References Cited

U.S. PATENT DOCUMENTS

| | | | |
|---|---|---|---|
| 7,633,829 B2 | 12/2009 | Fasoli et al. | |
| 7,683,419 B2 | 3/2010 | Akiyama et al. | |
| 7,889,538 B2 | 2/2011 | Toda | |
| 7,911,856 B2 | 3/2011 | Lee et al. | |
| 7,913,000 B2 | 3/2011 | Chung | |
| 7,940,564 B2 | 5/2011 | Park et al. | |
| 7,957,217 B2 | 6/2011 | Park et al. | |
| 8,243,541 B2 | 8/2012 | Cho et al. | |
| 8,565,029 B1* | 10/2013 | Stephens, Jr. | 365/189.11 |
| 2002/0105837 A1* | 8/2002 | Kim et al. | 365/189.09 |
| 2008/0024096 A1 | 1/2008 | Pan | |

(Continued)

OTHER PUBLICATIONS

Kong et al., "8 GB 3-D DDR3 DRAM Using Through-Silicon-Via Technology", pp. 111-119; IEEE Journal of Solid-State Circuits, vol. 45, No. 1, Jan. 2010.

(Continued)

*Primary Examiner* — Hien Nguyen
(74) *Attorney, Agent, or Firm* — Dennis R. Haszko

(57) ABSTRACT

Structures and related processes for effectively regulating power among slave chips in a 3D memory multichip package that employs TSVs for interlevel chip connections. Individual voltage regulators are employed on one or more of the slave chips for accurate level control of internal voltages, for example, word line driver voltage (VPP), back bias voltage (VBB), data line voltage (VDL), and bit line pre-charge voltage/cell plate voltage (VBLP/VPL). Employing regulators on one or more of the slave chips not only allows for precise regulation of power levels during typical memory stack operation, but also provides tolerance in small variations in power levels caused, for example, by manufacturing process variations. Moreover, less chip real estate is used as compared to techniques that provide complete power generators on each chip of a multichip stack.

59 Claims, 12 Drawing Sheets

(56) References Cited

U.S. PATENT DOCUMENTS

| | | |
|---|---|---|
| 2008/0155196 A1 | 6/2008 | Black et al. |
| 2009/0070727 A1 | 3/2009 | Solomon |
| 2009/0168482 A1 | 7/2009 | Park et al. |
| 2009/0245445 A1 | 10/2009 | Saen et al. |
| 2010/0060312 A1 | 3/2010 | Toms |
| 2010/0072606 A1 | 3/2010 | Yang |
| 2010/0091537 A1 | 4/2010 | Best et al. |
| 2010/0172172 A1 | 7/2010 | Kim et al. |
| 2011/0121811 A1 | 5/2011 | Dennard et al. |
| 2011/0157978 A1 | 6/2011 | Shinozaki et al. |
| 2011/0228586 A1 | 9/2011 | Kawabata et al. |
| 2012/0127798 A1* | 5/2012 | Gillingham .............. 365/185.18 |

OTHER PUBLICATIONS

Sato, Katsuyuki, et al. "Session XVII: Megabit DRAMs, FAM 17.9: A 20ns Static Column 1Mb DRAM in CMOS Technology", pp. 254-255; 1985 IEEE International Solid-State Circuits Conference, Feb. 15, 1985.

* cited by examiner

VOLTAGE REGULATION FOR 3D PACKAGES AND METHOD OF MANUFACTURING SAME

TECHNICAL FIELD

The present disclosure relates generally to 3D stacked chips, and more specifically to voltage control and regulation within 3D stacked multichip packages and related methods of manufacturing such 3D stacked multichip packages.

BACKGROUND

The emergence of mobile consumer electronics, such as cellular telephones, notebook computers, personal digital assistants (PDAs), and MP3 players to name but a few, has increased the demand for compact, high performance memory devices. In many ways, the modern development of semiconductor memory devices may be viewed as a process of providing the greatest number of data bits at defined operating speeds using the smallest possible device. In this context, the term "smallest" generally denotes a minimum area occupied by the memory device in a "lateral" X/Y plane, such as a plane defined by the primary surfaces of a printed circuit board or module board. Not surprisingly, restrictions of the tolerable lateral area occupied by a memory device have motivated memory device designers to vertically integrate the data storage capacity of their devices. Thus, for many years now, multiple memory devices that might have been laid out adjacent to one another in a lateral plane have instead been vertically stacked one on top of the other in a vertical Z plane relative to the lateral X/Y plane.

Recent developments in the fabrication of so-called "Through Silicon Vias (TSVs)" have facilitated the trend towards vertically stacked semiconductor memory devices. TSVs are interchip connection elements that pass substantially, if not completely, through a substrate, and are fully contained within the periphery of the stacked substrates. TSVs are distinct from and have largely replaced vertical connection elements running up the outer edges of stacked memory devices. Such external wiring (i.e., wiring disposed on the periphery) was conventionally required to operatively connect the stacked devices. But this wiring increases the overall lateral area occupied by the stacked device, and typically requires interposing layers between adjacent substrates in the stack. Because TSVs pass vertically upward through a substrate, no additional lateral area is required beyond that defined by the periphery of the largest substrate in the stack. Further, TSVs tend to shorten the overall length of certain critical signal paths through the stack of devices, thereby facilitating faster operating speeds.

Stacked semiconductor memory devices are one type of three dimensional (3D) integrated circuits. That is, from the standpoint of other system components such as a memory controller, a 3D memory apparatus functions as an integral memory device. Data write and data read operations are processed by the 3D memory device in order to store write data or retrieve read data in ways generally applicable to non-stacked (i.e., single substrate) memory devices. Yet, the 3D memory apparatus is able to store and provide a great deal more data per unit lateral surface area, as compared to a non-stacked memory device.

Thus, through the use of TSVs or similar stack fabrication processes, memory (and other) apparatuses implemented with a plurality of vertically stacked substrates or chips are able to store and provide a large amount of data using a single integrated circuit having a relatively small lateral surface area footprint. However, surface area efficient storage and retrieval of data from a 3D memory apparatus poses a number of related challenges to the memory apparatus and system designer.

Consider for the moment the conventional single layer Dynamic Random Access Memory (DRAM) 10 shown in FIG. 1. A DRAM memory cell array 12 comprises a great number of individual memory cells arranged in relation to a matrix of row and column signal lines. Each memory cell is able to store write data in response to a write command and provide read data in response to a read command received from an external device (not shown), such as a memory controller or processor. Read/write commands result in the generation of certain control signals (e.g., a row address, a column address, enable signals, etc.), which, along with certain control voltages, are applied to memory cell array 12 through related peripheral devices, such as row decoder 11 and column decoder 13.

During a write operation, write data (i.e., data intended to be stored in memory cell array 12) passes from the external circuit (e.g., an external memory, an external input device, a processor, a memory controller, a memory switch, etc) to data registers 15-4 of the peripheral blocks 15. Once stored in data registers 15-4, the write data may be written to memory cell array 12 through conventional structures and techniques, which may include, for example, sense amplifier and write driver circuitry 14.

During a read operation, applied control voltages, as well as the control signal outputs of row decoder 11 and column decoder 13 generally cooperate to identify and select one or more memory cell(s) in memory cell array 12 and facilitate the provision of signals indicating the value of data stored in the memory cell(s). The resulting "read data" typically passes through read sense amplifier 14 to be stored in data registers 15-4. Read data stored in data registers 15-4 may be subsequently provided to the external circuit under the control of read control circuit 15-1.

Looking now collectively at FIGS. 2a and 2b, an exemplary TSV-based 3D stacked memory chip 20 is illustrated, and which typically consists of multiple slave chips 21 and a master chip 22, as well as an underlying substrate 23. Also illustrated are the TSVs 24 passing through the various chips, and interconnected using TSV bonding pads 25. This exemplary embodiment of a 3D TSV memory 20 requires different chip designs for the slave 21 and master 22 chips. Specifically, the master chip 22 does not need any specific logic block to test memory cell arrays; however, the slave chips 21 need additional logic blocks 26 to test and sort memory cell pass and fail. Also, the master chip 22 has an I/O interface 27 that is connected externally through package balls or pins, and also includes all DRAM operation relevant logic blocks 28, such as write/read control logic, refresh control, and internal power supplies (e.g., VBB, VPP, VBLP, VPLT, VDL, etc.).

These internal power supplies need to be regulated to get proper voltage levels no matter what the process voltage temperature (PVT) conditions, or any other conditions affecting performance, may be. Accordingly, what is needed in the art are techniques and related structures for effectively regulating power among slave chips in a 3D stacked multichip package that do not suffer from the deficiencies found in conventional approaches. The disclosed principles provide such solutions, as discussed in detail below.

SUMMARY

The disclosed principles provide for structures and related processes for effectively regulating power among slave chips in a 3D stacked multichip package, such as a 3D DRAM memory stack, that employs TSVs. Specifically, the disclosed technique employs individual voltage regulators on most or all of the slave chips for accurate level control of internal voltages, such as word line driver voltage (VPP), back bias voltage (VBB), data line voltage (VDL), and bit line pre charge voltage/cell plate voltage (VBLP/VPL) if the multichip package is multichip memory package. Employing regulators on most or all of the slave chips not only allows for precise regulation of power levels during typical memory stack operation, but also provides tolerance in small variations in power levels caused, for example, by manufacturing process variations. In contrast, conventional approaches employing power regulation from the master chip do not have small voltage level tolerance if there is significant process variation among the various layers in the 3D memory stack. Additionally, without individual slave chip regulation circuitry, power level variations can become higher as more stacked memory chips are attached. However, the disclosed technique also allows for effective power level regulation on slave chips, even if the number of stacked slave chips increases.

In one aspect, 3D stacked multichip packages are disclosed. In one exemplary embodiment, such a multichip package comprises a master chip and one or more slave chips. In such embodiments, the one or more slave chips are stacked with and electrically coupled to the master chip using chip interconnects, such as through-silicon vias (TSVs). Also in such an embodiment, the multichip package comprises an internal supply voltage generator located on the master chip and configured to generate an initial internal supply voltage. This initial internal supply voltage is sent to the one or more slave chips using the chip interconnects. Also, the multichip package may comprise a voltage regulator located on each of the master chip and at least one of the one or more slave chips. Each voltage regulator is configured to convert the initial internal supply voltage to a final internal supply voltage for use on each of the master chip and the at least one of the one or more slave chips.

In related embodiments, the internal supply voltage generator may be configured to generate an initial voltage, and the voltage regulators on each of the master chip and the at least one of the one or more slave chips are configured to step down the voltage to generate a voltage for use on each of the master chip and the at least one of the one or more slave chips. In some embodiments, a minimum level of the initial voltage is determined by a resistance of the chip interconnects used to send the initial voltage to the one or more slave chips, as well as a maximum current consumption of the voltage regulators.

In some embodiments, the internal supply voltage generator may comprise a charge pump circuit to generate the initial voltage. Also, each of the voltage regulators may comprise a voltage down converter and a voltage driver. In yet other embodiments, the master chip and the one or more slave chips comprise memory devices. In such embodiments, the internal supply voltage generator may be configured to generate an initial word line driver voltage, and the voltage regulators on each of the master chip and at least one of the one or more slave chips may be word line driver voltage regulators configured to step down the initial word line driver voltage to generate a final word line driver voltage for use on each of the master and one or more slave chips. In specific embodiments, the initial word line driver voltage generator comprises a charge pump circuit to generate the initial word line driver voltage, and each of the word line driver voltage regulators comprises a voltage-down converter and a voltage driver.

In other embodiments, the internal supply voltage generator may be configured to generate an initial data line voltage, and the voltage regulators on each of the master chip and at least one of the one or more slave chips may be data line voltage regulators configured to convert the initial data line voltage to generate a final data line voltage for use on each of the master and one or more slave chips. In related embodiments, the internal supply voltage generator comprises a division converter comprising a voltage divider and a negative feedback comparator for comparing a voltage from the voltage divider to a reference voltage, and the data line voltage regulators comprise a negative feedback comparator for comparing the final data line voltage to the initial data line voltage.

In still further embodiments, exemplary multichip packages constructed as disclosed herein may further comprise a back bias voltage generator on the master chip, wherein the back bias voltage generator may comprise a fast cycle oscillator circuit configured for active mode operation and a slow cycle oscillator circuit configured for standby mode operation. Additionally, exemplary multichip packages may further comprise a back bias voltage regulator on each of the master chip and at least one of the one or more slave chips, where each back bias voltage regulator may comprise a slow cycle oscillator configured for standby mode operation.

In other embodiments, exemplary multichip packages may further comprise a bit line pre-charge voltage/cell plate voltage generator on each of the master chip and at least one of the one or more slave chips for generating a bit line pre-charge voltage/cell plate voltage. In other embodiments, the internal supply voltage generator is configured to generate the initial internal voltage from a voltage external to the memory devices on the master chip. In some specific embodiments, the external voltage is derived from input/output circuitry of the multichip package.

In advantageous embodiments, the memory devices may comprise DRAM memory devices. Also, in some embodiments the one or more slave chips may comprise a plurality of slave chips, where a first of the plurality of slave chips is stacked with the master chip, and others of the plurality of slave chips are successively stacked with the first of the plurality of slave chips. In such embodiments, the master chip and plurality of slave chips are electrically connected using the chip interconnects. In more specific embodiments, the chip interconnects comprise through-silicon vias.

In more specific exemplary embodiments, a multichip package constructed in accordance with the disclosed principles comprises a master chip that includes memory devices therein, and one or more slave chips that also include memory devices thereon. The one or more slave chips are stacked with and electrically coupled to the master chip using chip interconnects. Also in such embodiments, the multichip package may comprise an initial word line driver voltage generator located on the master chip and configured to generate an initial word line driver voltage. The multichip package may then also comprise a word line driver voltage regulator located on each of the master chip and at least one of the one or more slave chips. Each such word line driver voltage regulator is configured to step down the initial word line driver voltage to generate a final word line driver voltage on each of the master chip and the at least one of the one or more slave chips. Furthermore, this embodiment of a multichip package may include an initial data line voltage generator located on the master chip and configured to generate an initial data line voltage, as well as a data line voltage regulator located on each of the master chip and at least one of the one or more slave chips. Each such data line voltage regulator is configured to convert the initial data line voltage to a final data line voltage on each of the master chip and the at least one of the one or more slave chips.

In some embodiments, the initial word line driver voltage generator comprises a charge pump circuit to generate the initial word line driver voltage, and each of the word line driver voltage regulators comprises a voltage-down converter and a voltage driver. In other embodiments, the internal supply voltage generator comprises a division converter comprising a voltage divider and a negative feedback comparator for comparing a voltage from the voltage divider to a reference voltage, and the data line voltage regulators comprise a negative feedback comparator for comparing the final data line voltage to the initial data line voltage.

In still further embodiments, exemplary multichip packages constructed as disclosed herein may further comprise a back bias voltage generator on the master chip, wherein the back bias voltage generator may comprise a fast cycle oscillator circuit configured for active mode operation and a slow cycle oscillator circuit configured for standby mode operation. Also, exemplary multichip packages may further comprise a back bias voltage regulator on each of the master chip and at least one of the one or more slave chips, where each back bias voltage regulator may comprise a slow cycle oscillator configured for standby mode operation.

In other embodiments, exemplary multichip packages may further comprise a bit line pre-charge voltage/cell plate voltage generator on each of the master chip and at least one of the one or more slave chips for generating a bit line pre-charge voltage/cell plate voltage. In other embodiments, the internal supply voltage generator is configured to generate the initial internal supply voltage from a voltage external to the memory devices on the master chip. In some specific embodiments, the external voltage is derived from input/output circuitry of the multichip package.

In advantageous embodiments, the memory devices may comprise DRAM memory devices. Also, in some embodiments the one or more slave chips may comprise a plurality of slave chips, where a first of the plurality of slave chips is stacked with the master chip, and others of the plurality of slave chips are successively stacked with the first of the plurality of slave chips. In such embodiments, the master chip and plurality of slave chips are electrically connected using the chip interconnects. In more specific embodiments, the chip interconnects comprise through-silicon vias.

In other aspects, methods for voltage regulation on, for example, a 3D multichip package are disclosed. In one exemplary method, such a method may comprise providing a multichip package comprising a master chip and one or more slave chips. Such methods may also comprise generating an initial internal supply voltage on the master chip, and transmitting the initial internal supply voltage to at least one of the one or more slave chips stacked with and electrically coupled to the master chip using chip interconnects. Such exemplary methods may also comprise converting the initial internal supply voltage on each of the master chip and at least one of the one or more slave chips to a final internal supply voltage for use on each of the master chip and the at least one of the one or more slave chips.

In some embodiments, generating an initial internal supply voltage may comprise generating an initial voltage, and converting the initial internal supply voltage may comprise stepping down the initial voltage on each of the master and the at least of one of the one or more slave chips to generate a voltage for use on each of the master chip and the at least one of the one or more slave chips. In related embodiments, generating the initial voltage further comprises generating a minimum level of the initial voltage based on a resistance of the chip interconnects used to send the initial voltage to the one or more slave chips, as well as a maximum current consumption of the voltage regulators.

In other embodiments, providing a multichip package comprising a master chip one or more slave chips may further comprise providing a multichip package comprising a master chip having memory devices and one or more slave chips having memory devices. In related embodiments, generating an initial internal supply voltage comprises generating an initial word line driver voltage, and converting the initial internal supply voltage comprises stepping down the initial word line driver voltage on each of the master chip and the at least one of the one or more slave chips to generate a final word line driver voltage for use on each of the master chip and that at least one of the one or more slave chips.

In still other embodiments, generating the initial word line driver voltage may comprise generating the initial word line driver voltage using a charge pump circuit on the master chip, and stepping down the initial word line driver voltage may comprise stepping down the initial word line driver voltage with voltage regulators, each comprising a voltage-down converter and a voltage driver, on each of the master chip and the at least one of the one or more slave chips.

In yet other embodiments, generating an initial internal supply voltage may comprise generating an initial data line voltage, and converting the initial internal supply voltage may comprise converting the initial data line voltage to generate a final data line voltage for use on each of the master chip and the at least one of the one or more slave chips. In related embodiments, generating the initial data line voltage comprises generating the initial data line voltage using a division converter comprising a voltage divider and a negative feedback comparator for comparing a voltage from the voltage divider to a reference voltage. In similar embodiments, generating the final data line voltage comprises generating the final data line voltage using a negative feedback comparator for comparing the final data line voltage to the initial data line voltage.

In other embodiments, exemplary methods as disclosed herein may further comprise generating on the master chip a back bias voltage configured for active mode operation, and a back bias voltage for standby mode operation. In related embodiments, exemplary embodiments may further comprise generating a back bias voltage on at least one of the one or more slave chips for standby mode operation. In other embodiments, exemplary methods as disclosed herein may further comprise generating a bit line pre-charge voltage/cell plate voltage on each of the master chip and at least one of the one or more slave chips.

In other embodiments of exemplary methods as disclosed herein, generating the internal supply voltage comprises generating the initial internal supply voltage from a voltage external to the memory devices on the master chip. In related embodiments, the external voltage is derived from input/output circuitry of the multichip package. Also, in some embodiments, providing the multichip package comprising a master chip having memory devices and one or more slave chips having memory devices further comprises providing a multichip package comprising a master chip having DRAM memory devices and one or more slave chips having DRAM memory devices.

In still other embodiments, providing the multichip package comprising one or more slave chips comprises providing a multichip package comprising a plurality of slave chips, a first of the plurality of slave chips stacked with the master chip, and others of the plurality of slave chips successively stacked with the first of the plurality of slave chips, the master chip and plurality of slave chips electrically connected using the chip interconnects. In some specific embodiments, transmitting the initial internal supply voltage to at least one of the one or more slave chips using chip interconnects further comprises transmitting the initial internal supply voltage to the at least one of the one or more slave chips using through-silicon vias.

In another embodiment, such a method for voltage regulation in accordance with the disclosed principles may comprise providing a multichip package comprising a master chip having memory devices and one or more slave chips having memory devices. Such methods may also comprise generating an initial word line driver voltage on a master chip, and then transmitting the initial word line driver voltage to at least one of the one or more slave chips. Such a slave chip is stacked with and electrically coupled to the master chip using chip interconnects. Also in these embodiments, the method may comprise stepping down the initial word line driver voltage on each of the master chip and the at least one of the one or more slave chips to generate a final word line driver voltage for use on each of the master chip and the at least one of the one or more slave chips. Such exemplary methods may further comprise generating an initial data line voltage on the master chip and transmitting the initial data line to the one or more slave chips using the chip interconnects. Then such methods could comprise converting the initial data line voltage on each of the master chip and at least one of the one or more slave chips to generate a final data line voltage on each of the master chip and the at least one of the one or more slave chips.

In some embodiments, generating the initial voltage further comprises generating a minimum level of the initial voltage based on a resistance of the chip interconnects used to send the initial voltage to the one or more slave chips, as well as a maximum current consumption of the voltage regulators.

In still other embodiments, generating the initial word line driver voltage may comprise generating the initial word line driver voltage using a charge pump circuit on the master chip, and stepping down the initial word line driver voltage may comprise stepping down the initial word line driver voltage with voltage regulators, each comprising a voltage-down converter and a voltage driver, on each of the master chip and the at least one of the one or more slave chips. In yet other embodiments, generating the initial data line voltage comprises generating the initial data line voltage using a division converter comprising a voltage divider and a negative feedback comparator for comparing a voltage from the voltage divider to a reference voltage. In similar embodiments, generating the final data line voltage comprises generating the final data line voltage using a negative feedback comparator for comparing the final data line voltage to the initial data line voltage.

In other embodiments, exemplary methods as disclosed herein may further comprise generating on the master chip a back bias voltage configured for active mode operation, and a back bias voltage for standby mode operation. In related embodiments, exemplary embodiments may further comprise generating a back bias voltage on at least one of the one or more slave chips for standby mode operation. In other embodiments, exemplary methods as disclosed herein may further comprise generating a bit line pre-charge voltage/cell plate voltage on each of the master chip and at least one of the one or more slave chips.

In other embodiments of exemplary methods as disclosed herein, generating the internal supply voltage comprises generating the initial internal supply voltage from a voltage external to the memory devices on the master chip. In related embodiments, the external voltage is derived from input/output circuitry of the multichip package. Also, in some embodiments, providing the multichip package comprising a master chip having memory devices and one or more slave chips having memory devices further comprises providing a multichip package comprising a master chip having DRAM memory devices and one or more slave chips having DRAM memory devices.

In still other embodiments, providing the multichip package comprising one or more slave chips comprises providing a multichip package comprising a plurality of slave chips, a first of the plurality of slave chips stacked with the master chip, and others of the plurality of slave chips successively stacked with the first of the plurality of slave chips, the master chip and plurality of slave chips electrically connected using the chip interconnects. In some specific embodiments, transmitting the initial internal supply voltage to at least one of the one or more slave chips using chip interconnects further comprises transmitting the initial internal supply voltage to the at least one of the one or more slave chips using through-silicon vias.

BRIEF DESCRIPTION OF THE DRAWINGS

The above and other objects and features of the principles disclosed herein will become apparent from the following detailed description taken in conjunction with the accompanying drawings, in which like numerals refer to like components, and in which.

DETAILED DESCRIPTION

As mentioned above, the disclosed principles provide for individual voltage regulator circuitry on each of the slave chips for accurate level control of internal voltages, such as word line driver voltage (VPP), back bias voltage (VBB), data line voltage (VDL), and bit line pre-charge voltage/cell plate voltage (VBLP/VPL). Although the foregoing exemplary labels are used to refer to supply voltages on 3D stacked multichip packages, those who are skilled in the art will recognize that such voltages may also be known by alternative names or designations. For example, data line voltage (VDL) may also be referred to simply as internal voltage ($V_{int}$) or memory cell voltage ($V_{cell}$) in some applications. Similarly, although VDD is used herein to refer to an external voltage from the memory devices of a memory array, such as the input/output circuitry voltage, such voltage may also be referred to simply as external voltage ($V_{ext}$). As such, the bit line pre-charge voltage (VBLT) referred to herein may simply be referred to as one half of the external voltage (VDD/2). Thus, the terms used herein to reference voltages within a multichip package are merely exemplary in nature and should not be read to limit the principles disclosed herein, and other terms or designations used to identify such voltages may also be used yet fall within the broad scope of the present disclosure.

Additionally, although "through-silicon vias" (TSVs) are described herein in exemplary embodiments, it should be understood that any general chip interconnect may also be employed with the disclosed principles. Thus, no limitation to any specific TSV structure, or that such interconnects are only intended to be formed through silicon-based layers, is intended or should be implied. Moreover, although illustrations herein may show exemplary multichip packages stacked in a vertical configuration, it should be understood that such embodiments are merely illustrative, and thus no limitation to a vertically oriented stacked package or vertically arranged chip interconnects is intended or should be implied. Accordingly, multichip packages as disclosed herein may also be stacked and interconnected horizontally or in any other orientation, as each application may demand. Furthermore, although multichip packages having memory devices, for example, DRAM memory chips and packages, are described in many of the embodiments disclosed herein, it should be further understood that such description of memory chips is merely illustrative. Thus, the principles disclosed herein should not be interpreted to be limited to use with memory-based multichip packages, and instead should be understood to be applicable to any type of chip package that may benefit from the teachings provided herein.

Figure 3:
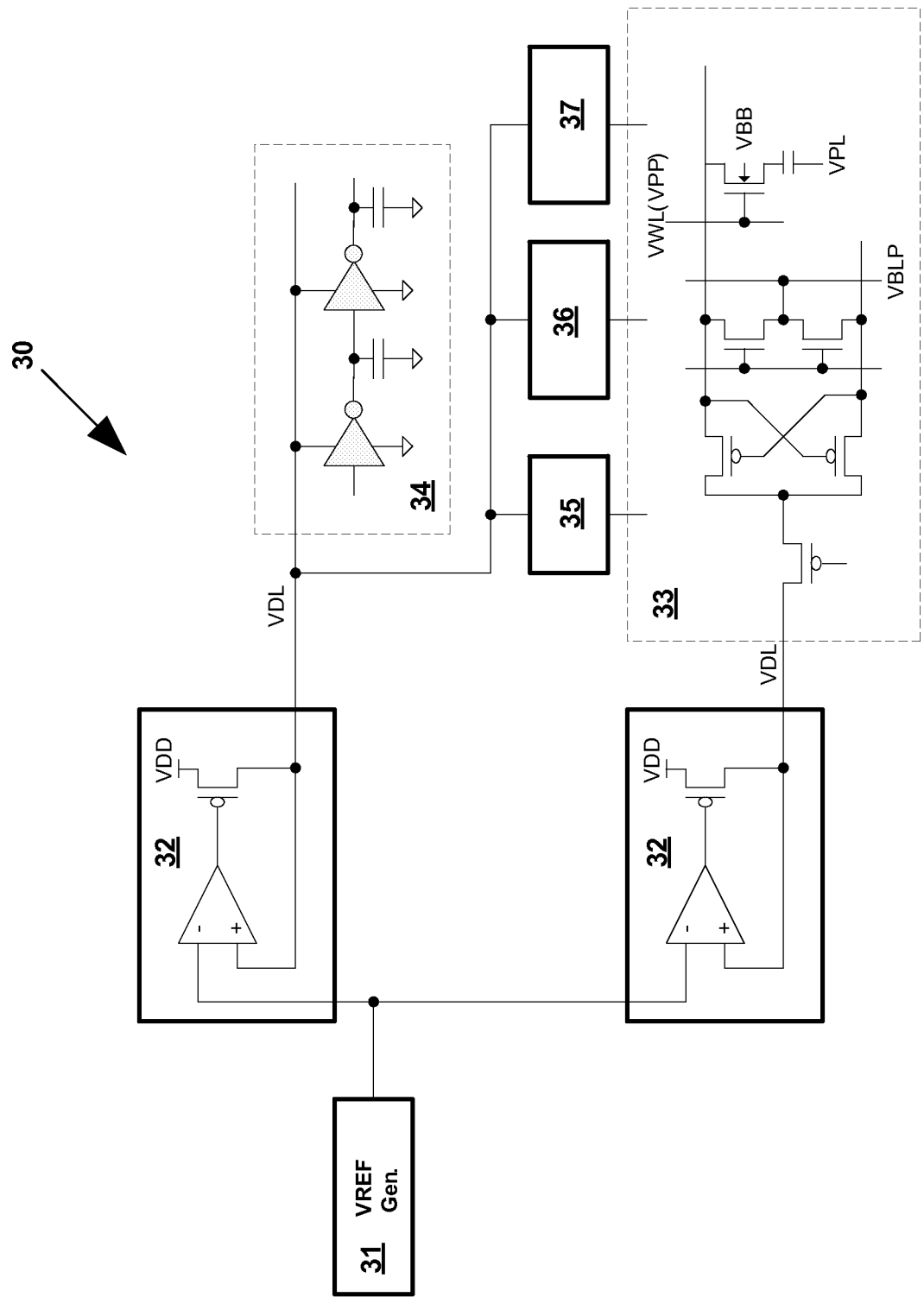
FIG. 3 illustrates one embodiment of the power configuration for a DRAM memory device, in accordance with the disclosed principles.

FIG. 3 illustrates one embodiment of the power configuration 30 for a DRAM memory device. The power supply circuits on a master chip in a 3D memory multichip stack constructed in accordance with the disclosed principles can have the same requirements of a single DRAM internal power configuration, such as the one shown in FIG. 3. For example, a $V_{ref}$ generator 31 generates the reference voltage for one or more VDL generators 32, which are each typically a combination of a comparator and a PMOS driver, as illustrated. Typically, there are two core voltage drivers for VDL in order provide noise immunity and a more stable level, as may be seen with other power sources. As shown, one VDL generator 32 generates VDL for the memory cell array 33, while a second VDL generator 32 generates VDL for periphery components 34. In many applications, the VDL connected to the memory cell array has more noise from core sensing and writing operations. Thus, by employing such a separate driver configuration, noise coupling can be avoided and can provide for a more clean power source for VPP, VBB, VBLP/VPL.

The VPP generator 35 generates a VPP level for the memory cell array 33, and typically affects high data level and refresh characteristics of a DRAM cell. As illustrated in FIG. 3, VPP is typically VDL+2*$V_t$ (threshold voltage of the NMOS cell access transistor)+α, and is connected to the PMOS gate node of the word line driver and the N-well of the word line driver area of the chip. The VBLP/VPL generator 36 generates a half-level of VDL, as shown, which is closely related to the cell signal voltage and its reference voltage for sensing data from memory devices on the array. The VPL is connected to the plate of a DRAM memory cell to improve the reliability of the cell by halving voltage stress to a cell capacitor (usually comprising an ONO (oxide-nitride-oxide) construction). The VBB generator 37 enhances cell stabilization by generating a negative biased VBB, which makes the cell less sensitive to substrate noise. The substrate noise could cause unwanted forward biasing of the NMOS p-n junction, and thus considerably decrease the cell access transistor threshold voltage so that stored charges in a memory cell easily escape to the data line. Also, by helping reduce cell access transistor junction leakage, the refresh characteristics of the DRAM cell may be significantly improved. The other benefit of a negative VBB is that the bit line capacitance is reduced by the reduction of NMOS p-n junction capacitance.

Figure 4:
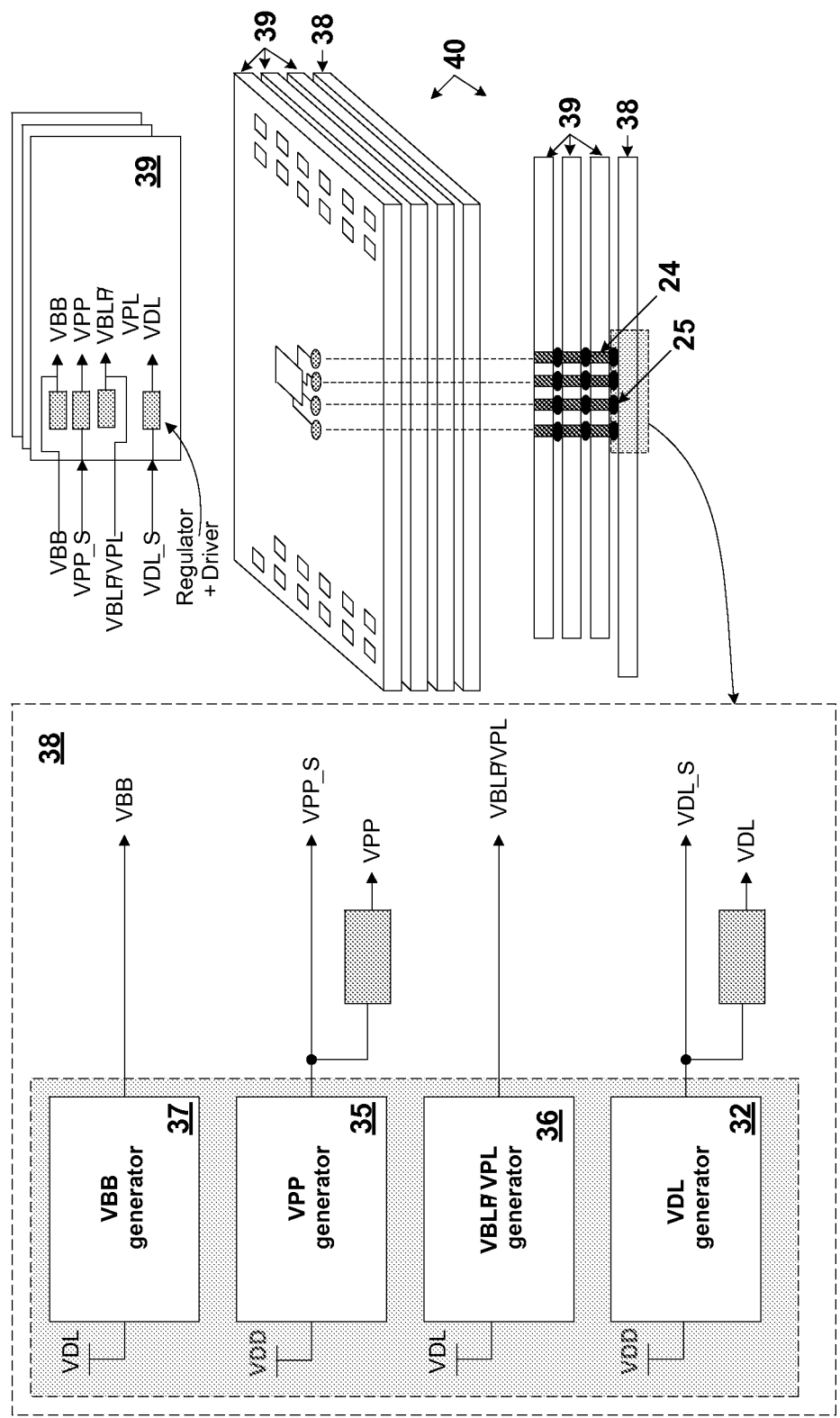
FIG. 4 illustrates the various voltage generators discussed above, as laid out on either the master chip, the slave chips, or both, of a 3D stacked memory array constructed in accordance with the principles disclosed herein.

FIG. 4 illustrates the various voltage generators discussed above, as laid out on either the master chip 38, the slave chips 39, or both, of a 3D stacked memory array 40 constructed in accordance with the principles disclosed herein. The proposed stacked multichip memory array 40 consists of two main structures, which are $1^{st}$ and $2^{nd}$ level power supply blocks used to provide separate regulation of voltage levels and drivers with respect to the master chip 38 versus one or more of the slave chips 39. In particular, and as described in further detail below, embodiments of multichip packages constructed in accordance with the disclosed principles may include a VBB generator 37 on each of the master chip 38 and one or more of the slave chips 39. Similarly, a VBLP/VPL generator 36 may be included on each of the master chip 38 and one or more of the slave chips 39. Also in accordance with the disclosed principles, while a complete VPP generator 35 is included on the master chip 38, only portions of the VPP generator 35 circuitry may be included on one or more of the slave chips 39. Likewise, although a complete VDL generator 32 is included on the master chip 38, only portions of the VDL generator 32 circuitry may be included on one or more of the slave chips 39.

Figure 1:
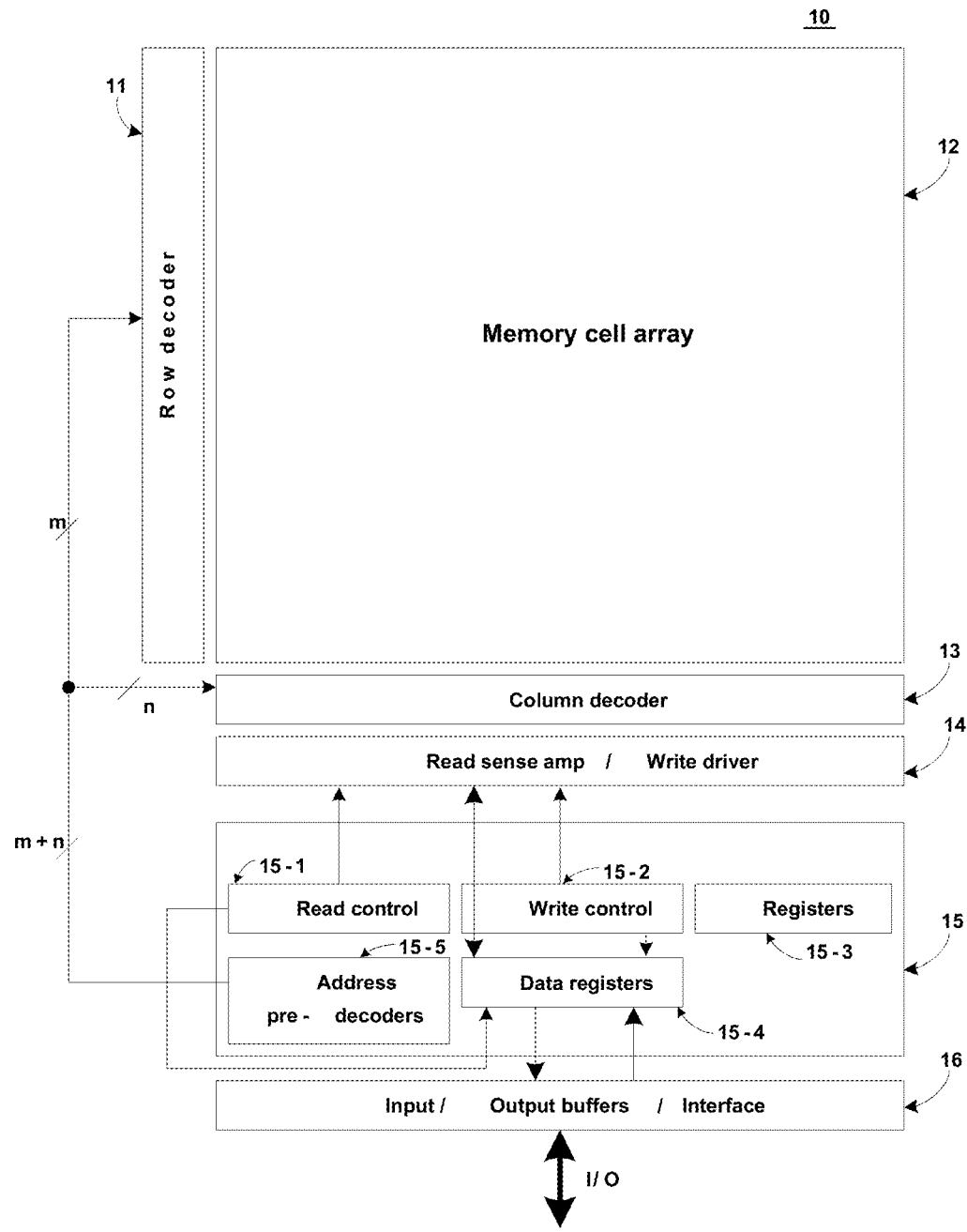
FIG. 1 illustrates one embodiment of a conventional single layer Dynamic Random Access Memory (DRAM) device.
Figure 2A:
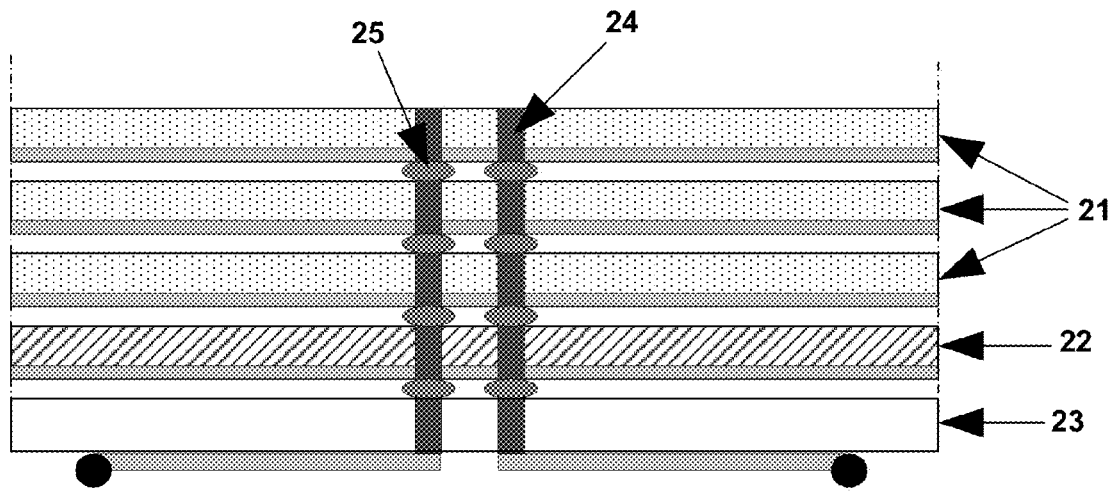
FIGS. 2a and 2b illustrate one embodiment of a conventional 3D memory stack incorporating interlevel TSVs between a master chip and multiple slave chips.
Figure 2B:
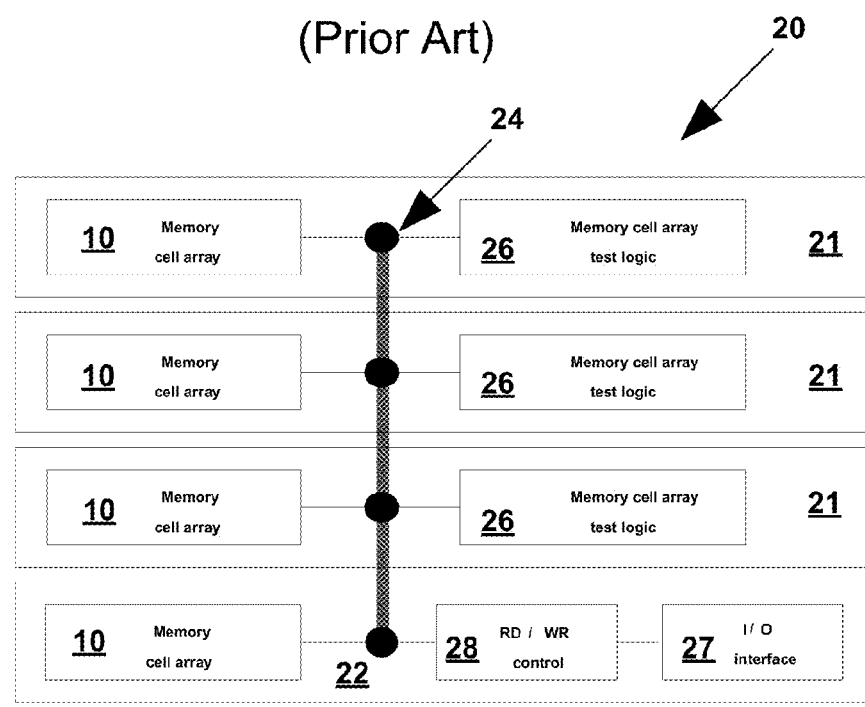

As such, the proposed design provides more accurate and stable voltage levels, and quick response of voltage drivers is provided when sudden drop or change in internal voltage levels happens due to simultaneous operations within 3D multichip packages, such as refresh operations on each slave chip 39 of a 3D stacked DRAM device. In conventional 3D multichip packages, looking back briefly at FIGS. 2a and 2b, the local placement of such internal power supplies makes correct voltage level control from the master chip 22 for each slave chip 21 extremely difficult. An alternative conventional approach is to have independent power supplies for each chip, and thus have a separate regulating control block for each and every chip, master and slave. However, this approach could result in internally inappropriate voltage levels that could lead to malfunctions in chip operations. Because each chip in conventional 3D memory stacks has distinct voltage regulators and separate drivers, unstable operations may result in different regulated voltages on each chip.

More specifically, in the initially mentioned conventional approach, the master chip 22 has all the power supplies to generate VPP, VDL, VBB, VBLP/VPL, and all internally generated voltages from the master chip 22 are connected to the slave chips 21 with TSVs. Thus, the test for the slave chips 21 without internally generated voltages at the wafer test stage is performed by external forcing of all required power through the TSV pad, which is similar in size to a normal probing pad. All voltage level regulation is done at the master chip 22 and thus the slave chips 21 do not have any control logic to regulate the internal voltage levels. By this single power supply regulation and driving from only the master chip 22, the voltage level of VPP, VBB, VDL, VBLP/VPL for example, can be unstable thereby causing incorrect timing conditions and malfunctions in memory cell write and read operations. Specifically, a simultaneous refresh operation of stacked DRAM devices is a key problem because it often invokes a big voltage level change by large current consumption at the same operation point. Due to the slow response time of the regulation circuitry located only on the master chip 22, the sudden voltage changes are not quickly compensated for.

What follows is a detailed discussion of the voltage level generation by each of the power supplies with respect to the master and slave chips of a 3D stacked muitichip memory package constructed according to the principles disclosed herein. In accordance with these principles, embodiments of such multichip packages may include a variety of power generator and regulator combinations with respect to VPP, VBB, VDL and VBLP/VPL voltage levels. As such, embodiments may include voltage generators and regulators for only one such supply voltage, or may include a combination of voltage generators and regulators for voltage control of two or more such supply voltage. Accordingly, the following description describes exemplary embodiments and methods for control of each of these on-chip voltages, but should not be interpreted to mean that control of all of these on-chip voltages is required in each embodiment described in accordance with the disclosed principles.

VBB Generator

Power consumption is one of the key issues in DRAM applications, especially in 3D stacked DRAM arrays. Accordingly, the use of back bias voltage (VBB) can reduce current consumption in semiconductor memory devices. With this in mind, a back bias voltage generator 37 in accordance with the disclosed principles consists of two main generation blocks. One is for standby mode and the other is for active mode, such as for refresh operations and write/read operations.

A 3D stacked DRAM array has a common input/output (I/O) for all slave chips 39 and the master chip 38, except for dedicated I/O configurations. For a 3D memory array in accordance with the disclosed principles, only one of the chips is selected from the 3D stacked DRAM array. For example, the master chip 38 has a complete VBB generator 37, which is employed to keep an appropriate negative VBB level for all operational situations of the master chip 38. With the use of TSVs on the stacked array, all inputs and outputs are commonly connected through all master and slave chips. The most significant bit (MSB) address (/least significant bit (LSB) address) or a separate chip enable operation is used to activate one of the chips (of the master/slave chips), as needed for a particular application or operation.

Figure 5:
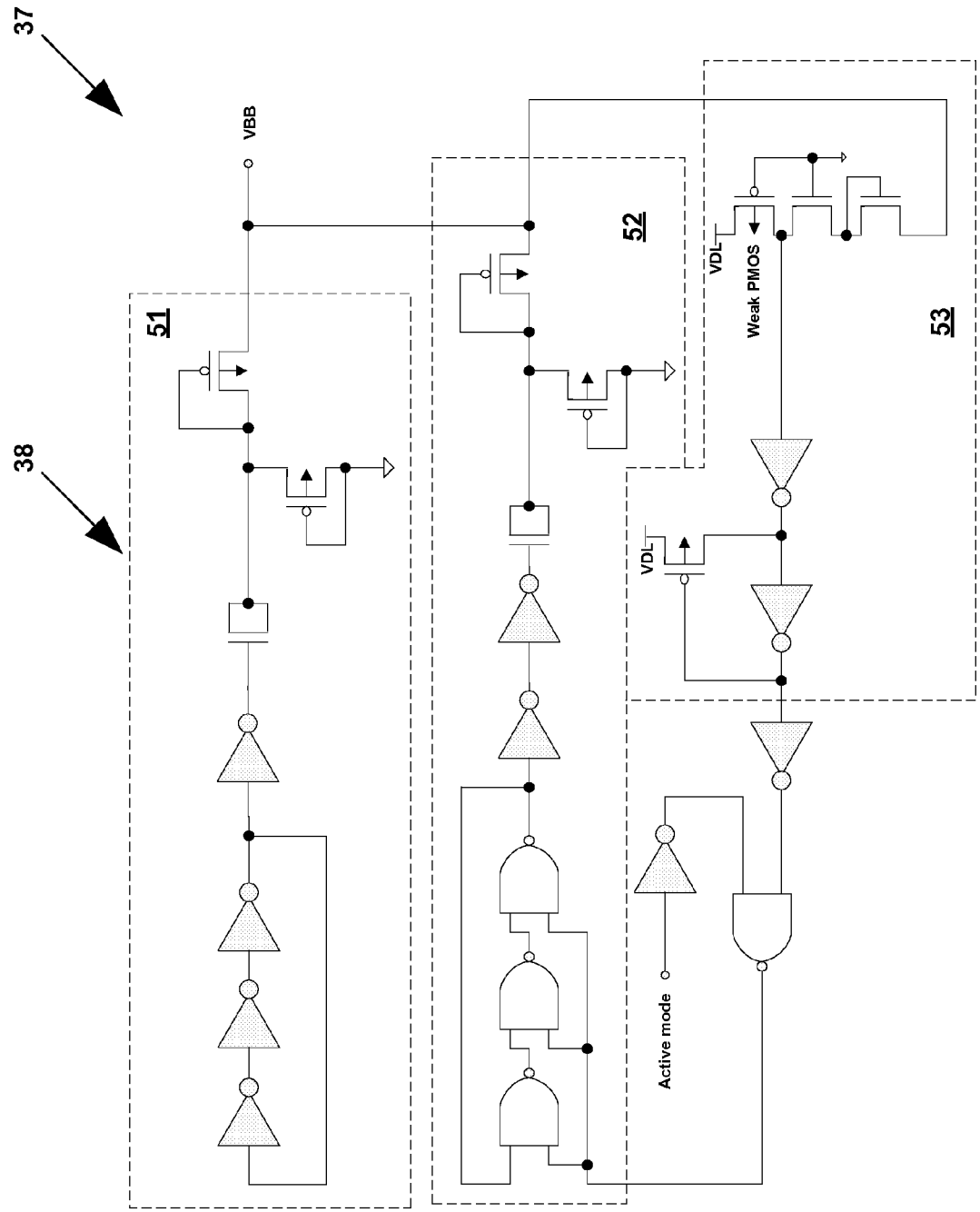
FIG. 5 illustrates an exemplary embodiment of a VBB generator for the master chip of 3D stacked DRAM array that features two sets of charge-pump circuits.

FIG. 5 illustrates an exemplary embodiment of a VBB generator 37 for the master chip 38 of a 3D stacked DRAM array that features two sets of charge-pump circuits. A slow cycle ring oscillator 51 is shown at the top part of FIG. 5, and supplies a small current during the retention and stand-by modes. A fast cycle ring oscillator 52 is shown on the bottom part of FIG. 5, and supplies a sufficiently larger current during the active cycle or when the level detector 53 detects that the VBB level is not in the proper negative range. As such, this level detector 53 minimizes the retention current by turning on/off the fast cycle circuit 52 when needed, based on such detection.

Figure 6:
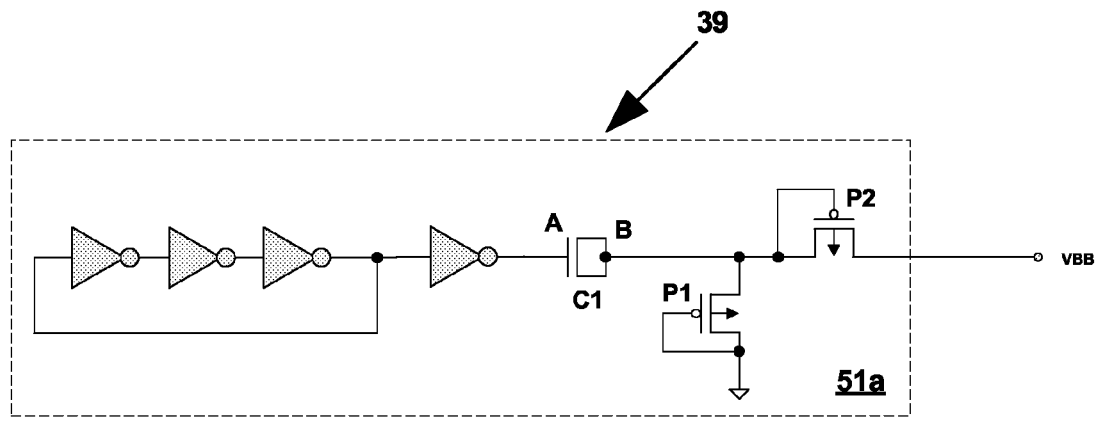
FIG. 6 shows a PMOS transistor-based pump circuit and oscillator, which is located on each slave chip.

FIG. 6 illustrates a VBB generator 51a for the slave chips 39 of a 3D stacked DRAM array, as provided by some embodiments of the disclosed principles. The VBB generator 51a on each of the slave chips 39 features only one charge-pump circuit. This charge-pump circuit is a slow cycle ring oscillator 51a like the slow cycle ring oscillator 51 found in the master chip 38 shown in FIG. 5, and supplies VBB current for retention and standby modes. Thus, in the illustrated embodiment, there are no charge-pump circuits on the slave chips 39 for the active cycles as is provided on the master chip 38. Alternatively, 3D stacked arrays constructed in accordance with the disclosed principles may include fast cycle ring oscillators on each of the slave chips 39 as well, if desired. In even other embodiments, slave chips 39 constructed as disclosed herein may include only fast cycle ring oscillators on each such chip, and exclude the slow cycle ring oscillators, depending on the particular desired application of the multichip stacked memory package. In still other embodiments, not all of the slave chips 39 may include a VBB generator 51a or a fast cycle ring oscillator. For example, in such embodiments, only select slave chips 39 could include a VBB generator 51a if adjacent slave chips 39 do not suffer from a large VBB leakage current, or for other reasons obviating the need for a VBB generator 51a on all of the slave chips 39 in a 3D package constructed as disclosed herein.

Figure 7:
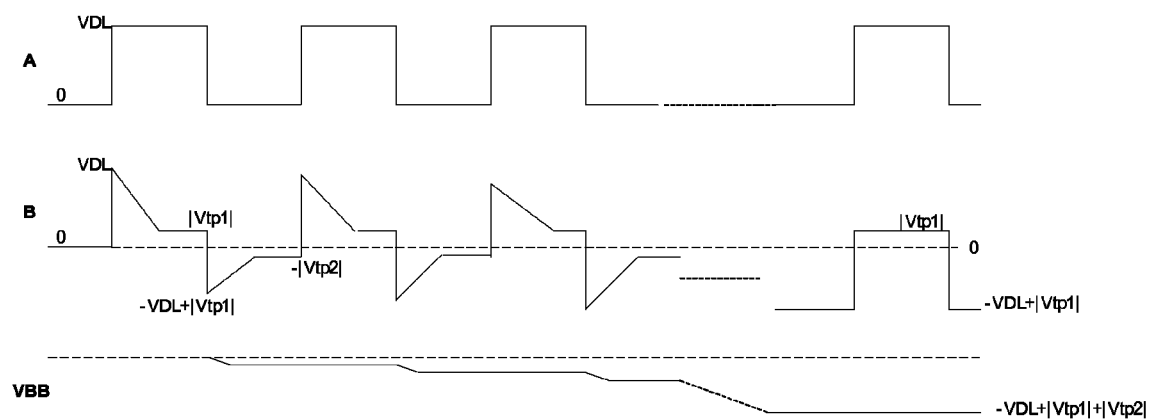
FIG. 7 illustrates waveform diagrams illustrating the VBB level generated by the generator circuit in FIG. 6, as well as voltage levels detected at nodes 'A' and 'B,' which are marked in the circuit diagram of the VBB generator.

Looking at FIGS. 6 and 7 in combination, FIG. 6 shows a PMOS transistor-based pump circuit and oscillator 51a that is located on each slave chip 39, as described above. A negative VBB is realized by extracting holes from the p-substrate using a PMOS transistor (P2) at the output node VBB. The use of a PMOS transistor helps avoid minority carrier (electrons) injection from the diode in the generator to the NMOS memory access base DRAM cells. FIG. 7 illustrates waveform diagrams illustrating the VBB level generated by the generator circuit 51a in FIG. 6, as well as voltage levels detected at nodes 'A' and 'B,' which are marked in the circuit diagram of the VBB generator 51a. In FIG. 7, node 'A' has an output of the oscillator, which generates high and low transitions repeatedly. This high and low transition invokes the same high and low transition to node 'B' by the coupling effect of a capacitor C1. However, the high level is discharged by PMOS transistor P1, and thus node 'B' becomes:

|Vtp1|(PMOS P1 threshold voltage).

When the level at node 'A' moves from high to low, the level at node 'B' becomes:

−VDL+|Vtp1| by the coupling effect of capacitor C1, and then an adjustment of:

|Vtp2| as the level at node 'A' remains low and approaches its transition to high again. By this operation, the holes from the p-substrate are extracted. At the final stage, the level at node 'B' becomes:

−VDL+|Vtp1| through the operation of the PMOS transistor P1 and the oscillator. The level at node 'VBB' is limited due to this −VDL+|Vtp1| level such that the VBB level becomes:

−VDL+|Vtp1|+|Vtp2|.

The same operation is performed at the master chip VBB generator 51. The active mode circuitry and VBB detector are simply controls to the VBB oscillator of the master chip 38. In DRAM operation, a DRAM array does not need to have a precisely accurate VBB level, unlike VPP and VDL. As such, some tolerance in the acceptable VBB range is allowed depending on the operating VDL level. Thus, in accordance with the disclosed principles, a slow cycle ring oscillator-based VBB generator is placed on each chip, including the master chip 38, which provides for VBB leakage recovery on each chip in the multichip package 40. The VBB current level of the slow cycle ring oscillator in the VBB generator is determined by the chip-level VBB leakage level. However, the determination of the exact VBB leakage is not typically possible due to process voltage temperature (PVT) variation. Therefore, the fast cycle VBB generator 51 on the master chip 38 provides enough VBB current to preserve the VBB voltage level. In particular, active operations such as write and read need more VBB current to hold a proper VBB voltage level. Thus, an 'active mode' signal is provided to activate the fast cycle circuit 52, as illustrated in FIG. 5. Moreover, for 3D memory arrays with stacked chips, the use of a fast cycle oscillator 52, in combination with the VBB level detector 53, helps reduce the possibility of unexpected VBB level changes by providing quick VBB level recovery.

VPP Generator

Figure 8:
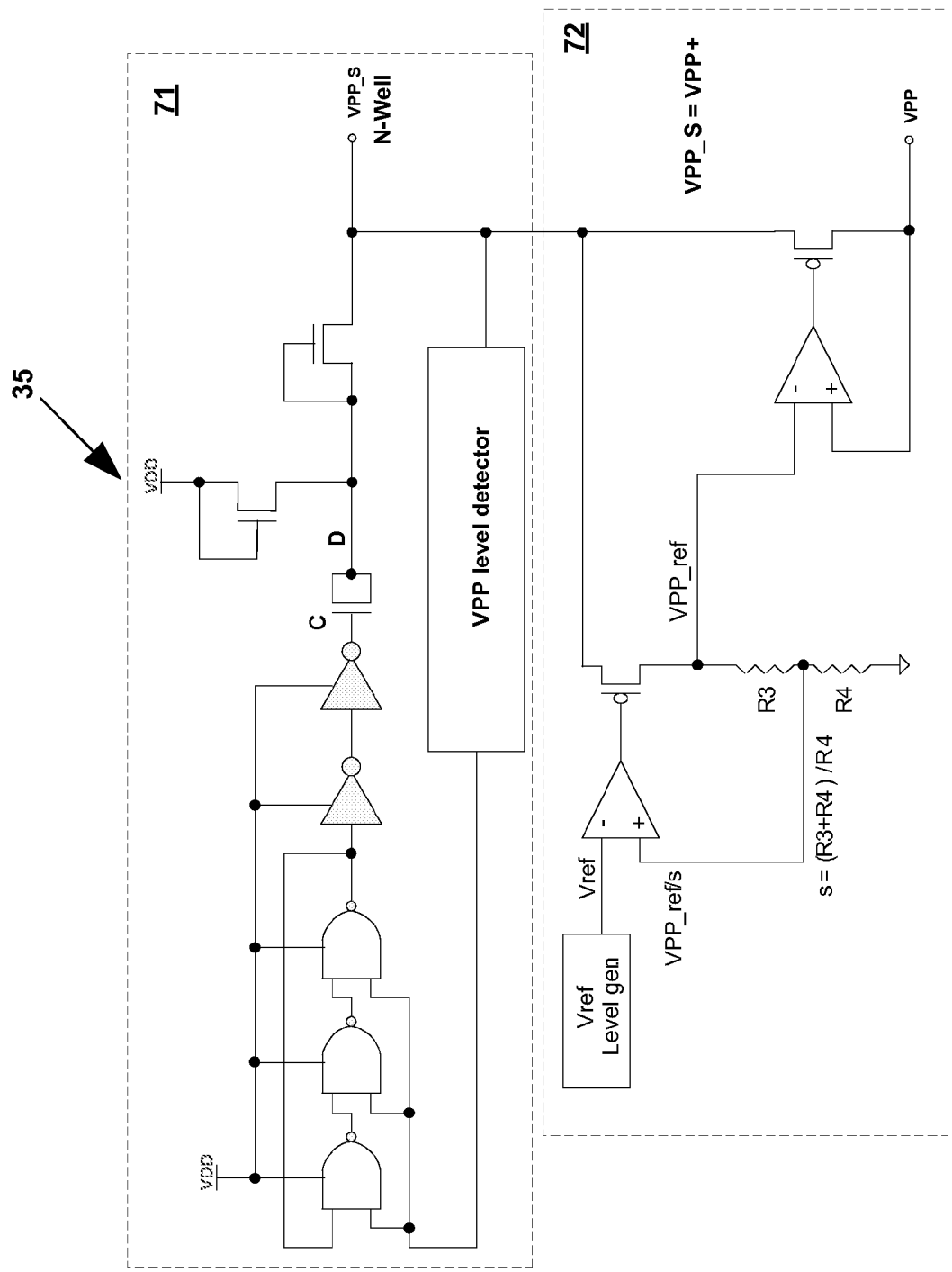
FIG. 8 illustrates one embodiment of an exemplary VPP generator for a master chip of a 3D stacked DRAM array constructed in accordance with the disclosed principles.

FIG. 8 illustrates one embodiment of an exemplary word line driver voltage (VPP) generator 35 for a master chip 38 of a 3D stacked DRAM array 40 constructed in accordance with the disclosed principles. In accordance with these disclosed principles, the VPP generator 35 is a voltage up converter, which generates an initial word line driver supply voltage level (VPP_S) that is significantly higher than the conventional word line driver voltage (VPP) voltage that would be generated and passed along to the slave chips in a conventional 3D DRAM multichip package. The advantages of this significantly higher word line driver supply voltage as provided by the disclosed principles are discussed below.

For conventional 3D stacked DRAM arrays, the source voltage for VPP levels is generated by a VPP generator, and this VPP is sent from the master chip to the slave chips using TSVs, as discussed above. This is illustrated on the left side of FIG. 9, which illustrates the VPP current flow from a master chip to multiple stacked slave chips through TSVs in a conventional 3D stacked array. However, TSVs have their own resistance based on the plug material used in their manufacturing process, as well as accumulated TSV distances. Thus, if there is a large current consumption from the slave chips (especially the top slave chip of a multiple slave chip stack), significant voltage drop typically occurs through the TSV plug material. As a result, the minimum VPP_S level requirement as provided by the presently disclosed principles is determined by TSV material sheet resistance and TSV width/length, along with maximum VPP current consumption from the DRAM cell array:

$VPP\_S > VPP+$(sheet resistance*length/width)×(maximum $IPP$ current from DRAM write/read operations).

Looking back at FIG. 8, the illustrated exemplary VPP generator 35 has two separate components comprising a charge pump circuit 71 and a $2^{nd}$ level driver 72. The higher VPP_S generated in the charge pump circuit 71 is fed to an N-well of a DRAM memory array, as well as fed to a voltage-down converter having a resistor-based divider and a PMOS driver ($1^{st}$ converter) and a comparator having a PMOS driver ($2^{nd}$ converter) in the $2^{nd}$ level driver 72. By using this hybrid combination, the ripple on the typical VPP level can be suppressed, as well as compensation for the voltage drop that occurs when IPP (VPP current) flows through TSVs in the layered routing of master and slave chips in a conventionally designed 3D stack.

Figure 9:
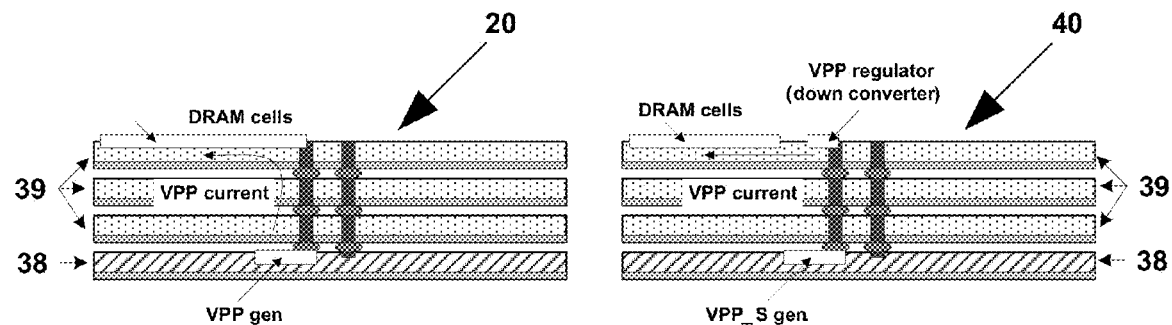
FIG. 9 illustrates the VPP current flow from a master chip to multiple stacked slave chips through TSVs.
Figure 10:
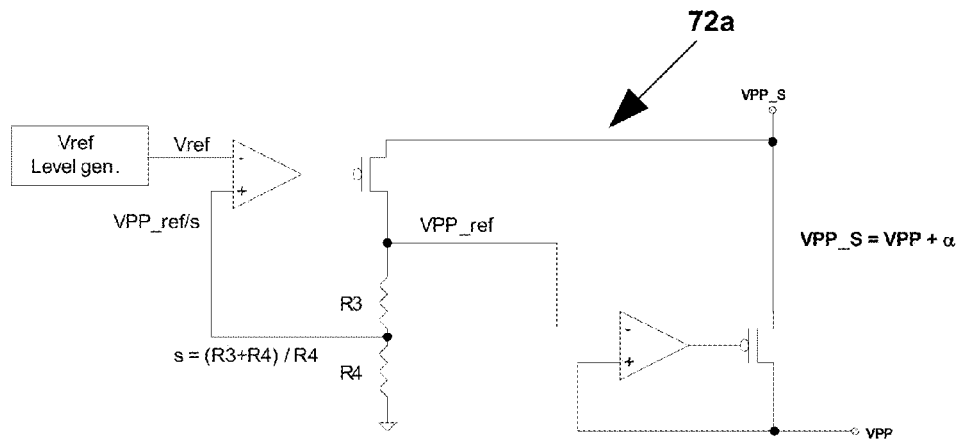
FIG. 10 illustrates one embodiment of a VPP regulator and driver circuit for the slave chips in a 3D stacked DRAM array constructed in accordance with the disclosed principles.

The right side of FIG. 9 illustrates a 3D DRAM stack constructed in accordance with the disclosed principles, and shows the transmission of VPP_S (i.e. VPP_S current) from the master chip 38 up through the TSVs 24 to the VPP regulators 72a on each of the slave chips 39. The VPP regulators 72a on each of the slave chips 39 are each the same down converting circuit 72 found in the $2^{nd}$ level driver on the master chip 33. FIG. 10 illustrates one embodiment of a VPP regulator and driver circuit 72a for the slave chips 39 in a 3D stacked DRAM array 40 constructed in accordance with the disclosed principles. A review of this word line driver voltage regulator 72a on each of the slave chips 39, which uses VPP_S as the source voltage, reveals that it is the same down converter circuitry used on the $2^{nd}$ level driver 72 of the master chip 38 to down convert VPP_S for use on the master chip 38 as well (see FIG. 8, discussed above). By employing the significantly higher VPP_S as a source voltage, the word line driver voltage regulators 72a on the slave chips advantageously provide a well regulated final VPP level for each slave chip 39, rather than the variations in final VPP at each slave chip that often occurs when final VPP is transmitted from a master chip. Moreover, by including only the VPP regulators 72a on the slave chips 39, less chip real estate is used as compared to the conventional approach that provides a complete VPP generator on each chip in a multichip package. In other embodiments, not all of the slave chips 39 may include a VPP generator 72a. For example, in such embodiments, only select slave chips 39 could include a VPP generator 72a if voltage drop through TSVs among adjacent slave chips 39 are not excessively large, or for other reasons obviating the need for a VPP generator 72a on all of the slave chips 39 in a 3D package constructed as disclosed herein.

Figure 11:
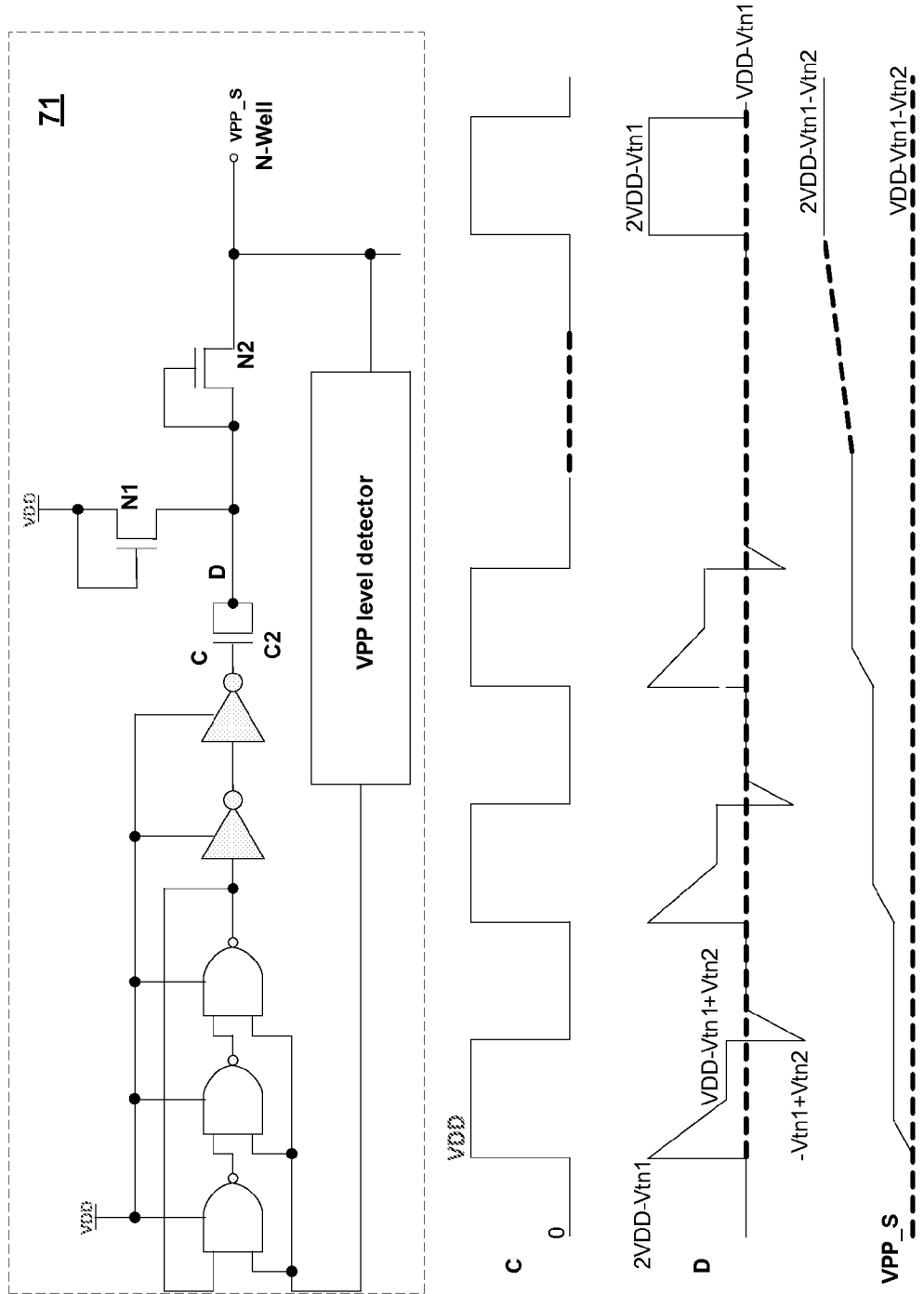
FIG. 11 illustrates the VPP_S generator circuit, and waveform diagram generated thereby, located on the master chip.

Turning now to FIG. 11, illustrated is the VPP_S generator circuit 71 located on the master chip 38 and initially discussed above. Also illustrated in FIG. 11 are waveform diagrams illustrating the VPP_S level, as well as voltage levels detected at nodes 'C' and 'D' which are marked in the circuit diagram of the VPP_S generator 71. Unlike conventional 3D stacked DRAM arrays, VPP_S, which is higher than VPP in accordance with the disclosed principles, is generated from VDD, VDD is an external voltage ($V_{ext}$), for example, a voltage used on the I/O side of the DRAM array, and is used to generate the significantly higher voltage level of VPP_S. From this higher VPP_S, the lower internal VPP level that is needed is generated from voltage down converters (72 and 72a) with VPP_S used as their input.

As shown in FIG. 11, node 'C' has an output of the ring oscillator of the charge pump circuitry, which generates high and low transitions repeatedly. This high and low transition invokes the same high and low transition to node 'D' by the coupling effect of a capacitor C2. However, the high level is discharged by as much as VDD−Vtn1+Vtn2 at node 'D' through the NMOS clamp transistor N1 and NMOS driver transistor N2 (where Vtn1 is the threshold voltage for transistor N1 and Vtn2 is the threshold voltage of transistor N2). When the level at node moves from high to low, the level at node D' becomes;

−Vtn1+Vtn2 by the coupling effect of capacitor C2. At the final stage, the level at node 'D' becomes:

VDD−Vtn1 through the operation of the NMOS transistor N1 and the oscillator. The level at node 'VPP_S' has its increase limited due to this −VDD−Vtn1 level such that the VPP_S level becomes:

2VDD−Vtn1−Vtn2.

Figure 12:
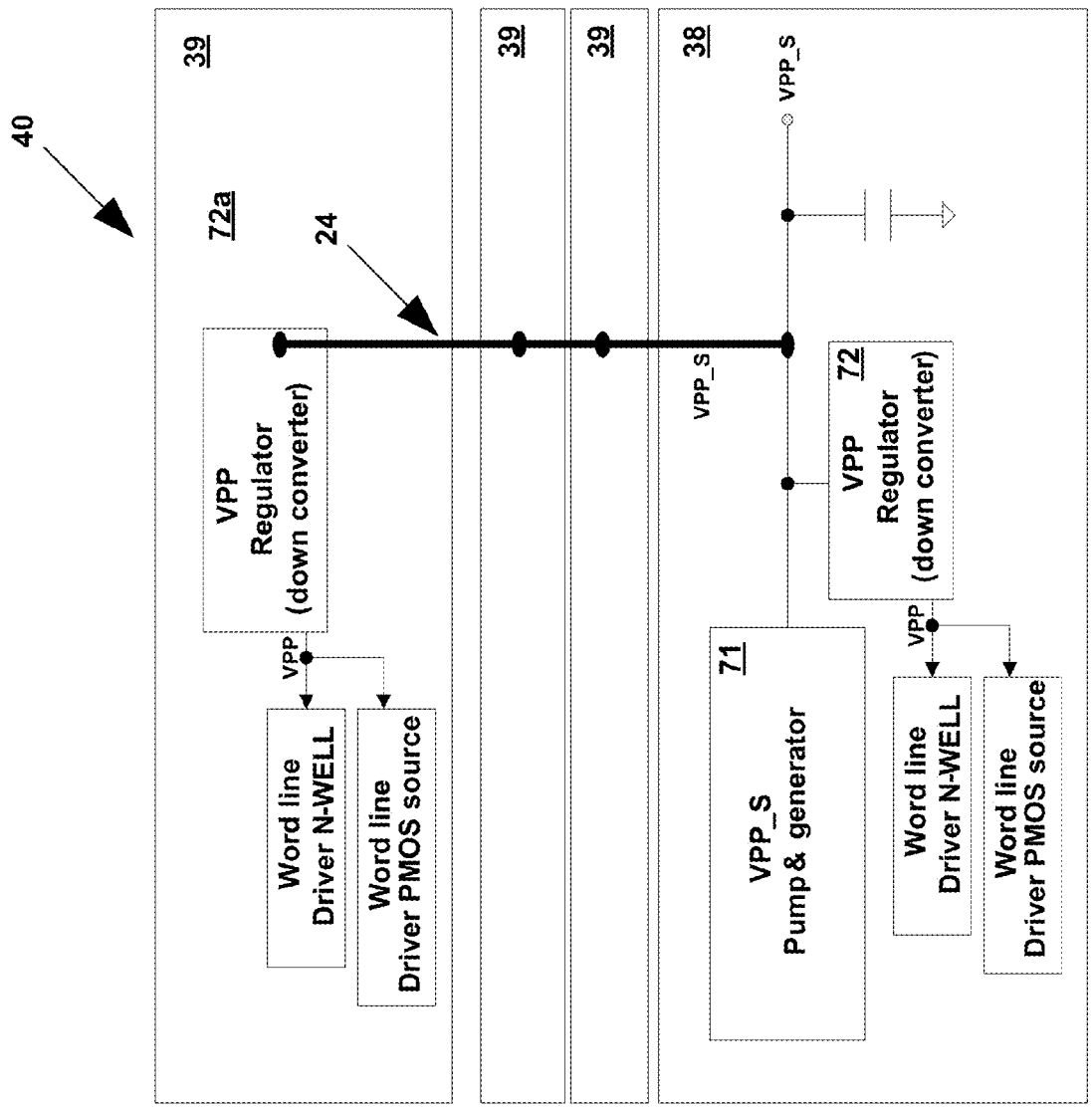
FIG. 12 illustrates a side view block diagram of a 3D stacked DRAM array in accordance with the disclosed principles and having the VPP down converters on each chip in the stacked array.

FIG. 12 illustrates a side view block diagram of a 3D stacked DRAM array 40 in accordance with the disclosed principles. In the illustrated array 40, three slave chips 39 can be seen stacked one over the other on a master chip 38. As discussed above, the VPP_S generator 71 can be seen located only in the master chip 38, and used to generate the higher VPP_S level. In addition on the master chip 38, the VPP regulator 72, which as discussed above is a voltage down converter circuit, is used to step down VPP_S to a usable VPP level for use by the word line driver N-well and the PMOS driver source. And also as provided by the disclosed principles, each of the slave chips 39 also includes a VPP regulator circuit 72a (only one of which is illustrated in FIG. 12).

By including a VPP down converter circuit 72a on each slave chip 39, the significantly higher VPP_S level can be transmitted through the TSVs 24 interconnecting the stacked slave chips 39 with the master chip 38 without suffering from voltage level loss typically caused by TSV resistances, since the VPP regulator circuits 72a on the slave chips 39 step down VPP_S to the usable VPP level. Specifically, each slave chip 39 has a VPP regulator 72a providing the voltage down converting of VPP_S, and thus VPP_S is the source voltage for these voltage down converters 72a. By this new VPP generation technique for TSV 3D stacked DRAM arrays, an accurate VPP level can be controlled on each chip in the stack. Accordingly, loss caused by transfer through TSVs, and well as sudden VPP drops, are compensated for by local VPP generation on each chip in a multichip package.

While the above embodiments describe the generation of VPP_S using VDD, VPP_S generation may also be performed using VDL. Similar oscillator circuitry may be employed in such embodiments, taking into account the difference in level of VDL versus VDD. Moreover, the embodiment discussed herein shows only one technique for VPP_S generation using VDD as a voltage source, and thus other techniques for the proposed VPP generation principle for slave chips are also within the broad scope of the present disclosure.

VBLP/VPL Generator

Figure 13:
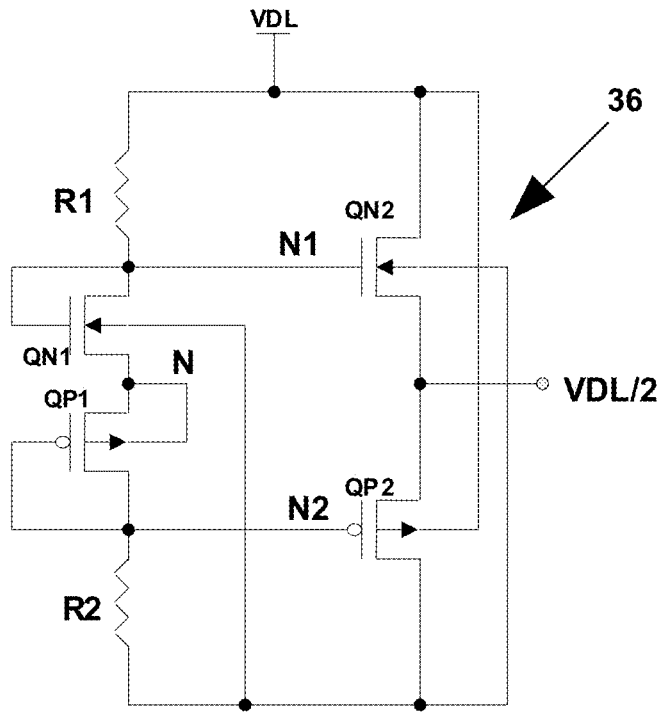
FIG. 13 illustrates a circuit diagram of one embodiment of a VBLP/VPL generator for generating the VBLP/VPL voltages.
Figure 14:
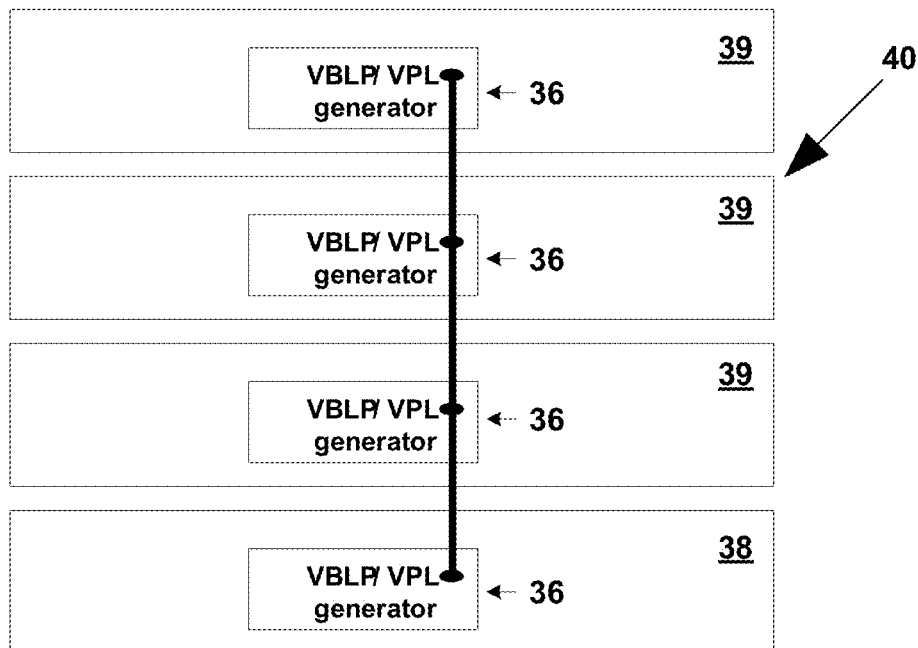
FIG. 14 illustrates a side view block diagram of a 3D stacked DRAM array in accordance with the disclosed principles and having a VBLP/VPL generator on each chip in the stacked array.

FIG. 13 illustrates a circuit diagram of one embodiment of a VBLP/VPL generator 36 for generating the bit line precharge voltage/cell plate voltage (VBLP/VPL). As disclosed herein, a VBLP/VPL generator 36 is constructed in each chip in the 3D stacked array 40, including the master chip 38 and all of the slave chips 39. Moreover, each of these VBLP/VPL generators 36 located on each chip does not comprise different driver structures from each other, or between 1$^{st}$ and 2$^{nd}$ stages, as found in conventional internal power generators. In contrast, and in accordance with the disclosed principles, the VBLP/VPL generators 36 have the same circuit structure on the master chip 38 and on one or more of the slave chips 39. Moreover, each VBLP/VPL generator 36 is commonly connected through the TSVs 24 of the memory array 40 (as illustrated in FIG. 14). These internal power VBLP/VPL generators 36 have pull-up and pull-down transistors (as illustrated in the circuit diagram of FIG. 13) to hold a one-half VDL level (VDL/2) across the common connection among all chips (master chip 38 and slave chips 39), and thus to maintain a steady VBLP/VPL voltage level among the stacked chips. In other embodiments, not all of the slave chips 39 may include a VBLP/VPL generator 36. For example, in such embodiments, only select slave chips 39 could include a VBLP/VPL generator 36 if bit line and plate leakage currents are not large enough on certain slave chips to require a VBLP/VPL generator 36 on such slave chips, or for other reasons obviating the need for a VBLP/VPL generator 36 on all of the slave chips 39 in a 3D package constructed as disclosed herein.

FIG. 14 illustrates a side view block diagram of a 3D stacked DRAM array 40 in accordance with the disclosed principles, similar to the array 40 illustrated in FIG. 12. In the illustrated array 40, once again three slave chips 39 can be seen stacked one with the other on a single master chip 38. As discussed above, and in accordance with the disclosed principles, the master chip 38 and the slave chips 39 each have a VBLP/VPL generator 36. By including a VBLP/VPL generator 36 on each of the stacked chips, VBLP/VPL is not transmitted through the TSVs 24 interconnecting the stacked chips with the master chip 38. Instead, VBLP/VPL voltage levels are individually generated on each of the chips in the 3D stacked array by the distinct VBLP/VPL voltage generators 36. Such an approach provides for more accurate VBLP/VPL level regulation between chips, and eliminates the potential level drops across TSVs when VBLP/VPL is generated only on (and transmitted from) the master chip 38, such as seen with conventionally designed stacked memory arrays.

VDL Generator

Figure 15:
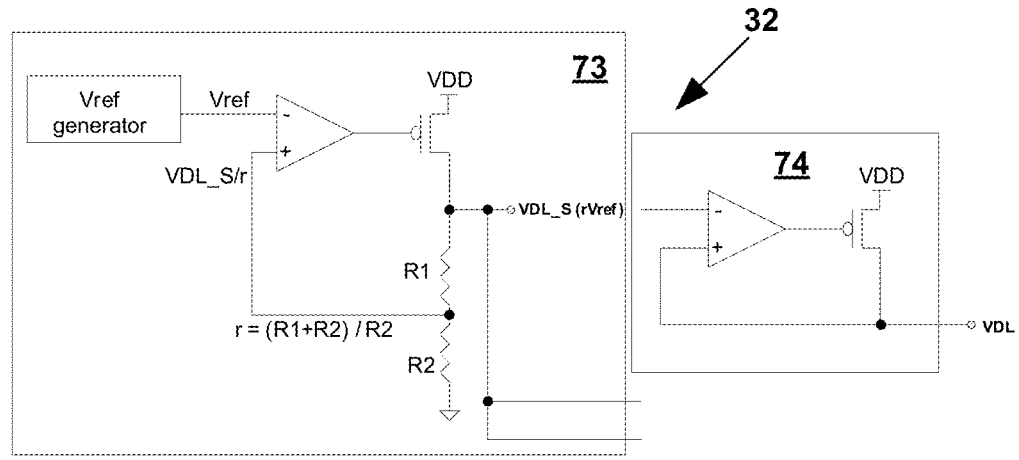
FIG. 15 illustrates one embodiment of exemplary of a VDL generator for a master chip.

FIG. 15 illustrates one exemplary embodiment of a data line voltage (VDL) generator 32 for a master chip 38, in accordance with the disclosed principles. In the embodiment of FIG. 15, a hybrid converter comprising two-stages is shown. The first stage is a VDL division converter 73, and the second stage is a conventional converter 74. The first stage VDL division converter 73 has less load capacitance and no load-current pulse. The VDL division converter 73 generates a reference voltage for the second stage converter 74 of the hybrid VDL generator 32. By using this type of hybrid structure, fast response by the VDL converter 32 is provided, and the second stage converter 74 can be placed on each of the chips in the multichip package 40 thereby eliminating the noise issues that typically occur from VIM, transmission from a master chip to its slave chips.

With continued reference to FIG. 15, the operation of the VDL division converter 73 is now explained. Specifically, a voltage reference level ($V_{ref}$) is obtained from a reference voltage generator, which typically consists of a bandgap voltage generator or other fixed voltage generation circuit. With a resistor-based voltage divider (R1, R2), an initial data line supply voltage (VDL_S) level is obtained through a PMOS driver, which is typically used in voltage down converters. Before comparing the VDL_S level, its level is divided and then is compared with the reference voltage $V_{ref}$. The resistance values for resistors R1 and R2 in the voltage divider are selected in order to generate the proper VDL_S level from a comparison to the reference voltage.

The resistor-based voltage divider is employed to have a low reference voltage $V_{ref}$ level from the bandgap voltage generator (or other type of generator circuit), which has less PVT variation. By employing this type of structure, the response time of such a negative feedback voltage down converter becomes slower due to resistors R1 and R2 being used as a voltage divider. In order to overcome this problem, however, the second negative feedback comparator in the second stage converter 74 is provided.

Figure 16:
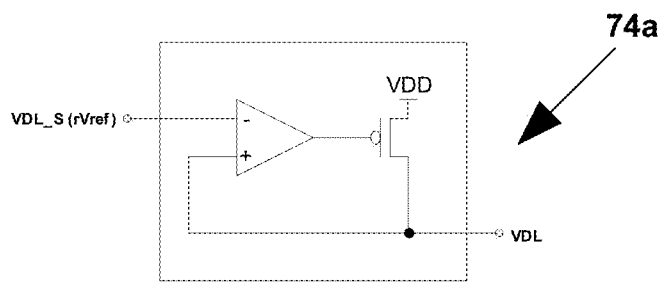
FIG. 16 illustrates an exemplary voltage down converter that is included on each of the slave chips of a 3D DRAM stack as disclosed herein.

FIG. 16 illustrates an exemplary voltage converter 74a that, in accordance with the disclosed principles, is included on each of the slave chips 39 of a 3D DRAM stack as disclosed herein. As shown, these voltage converters 74a on the slave chips 39 are the same as those included on the master chip 38, as discussed in detail above. In other embodiments, not all of the slave chips 39 may include a voltage converter 74a. For example, in such embodiments, only select slave chips 39 could include a voltage converter 74a if current consumption at certain slave chips 39 is not large enough to call for a voltage converter 74a on such slave chips, or for other reasons obviating the need for a voltage converter 74a on all of the slave chips 39 in a 3D package constructed as disclosed herein.

Figure 17:
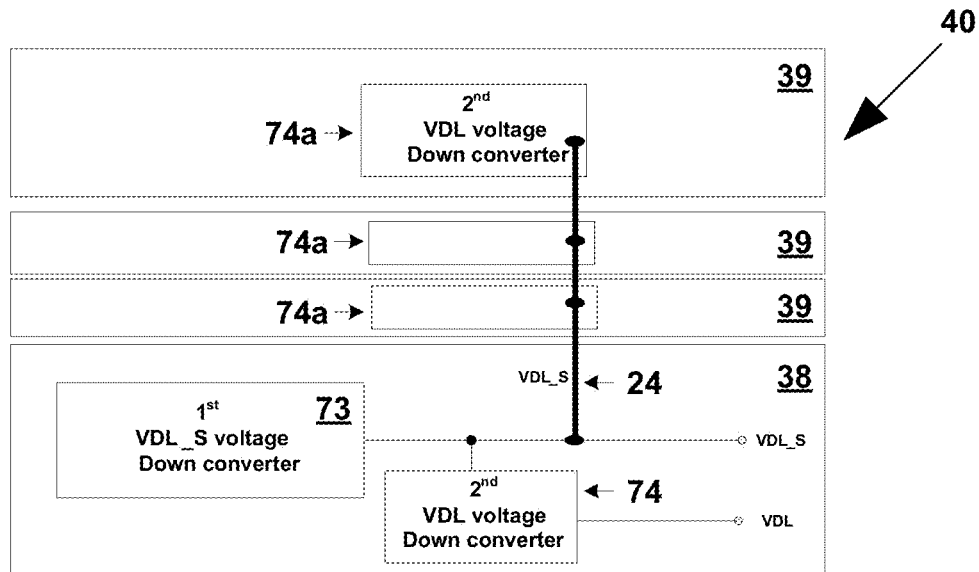
FIG. 17 illustrates a side view block diagram of a 3D stacked DRAM array and having the second stage VDL, down converters on each chip in the stacked array.

FIG. 17 illustrates a side view block diagram of a 3D stacked DRAM array 40 in accordance with the disclosed principles. In the illustrated array 40, three slave chips 39 can again be seen stacked one over the other on a master chip 38, and interconnected using TSVs 24. The first stage VDL division converter 73 is located only on the master chip 38, and used to generate the VDL_S, rather than the typical VDL level used in conventional stacked arrays. In addition on the master chip 38, the second stage converter 74 is used to generate the VDL level from the VDL_S of the first stage converter 73. Also as provided by in the present disclosure, each of the slave chips 39 includes a second stage converter 74a. Thus, just as the proper VPP level is created from VPP_S (as a source voltage) on each of the master and slave chips in a 3D stack constructed as disclosed herein, so too is the proper VDL level generated on each of the master and slave chips in the multilevel package using VDL_S (as a reference) and VDD. By employing the disclosed technique for VDL in 3D multichip packages, an accurate VDL level can also be controlled on each chip in the stack. As a result, losses caused by transfer through TSVs are again compensated for by local VDL generation on each chip in a multichip package, as was the case for local VPP generation discussed above. Additionally, less chip real estate is also required when compared to conventional approaches that provide complete VDL generator circuitry on each of the slave chips in an attempt to compensate for VDL transmission losses.

While various embodiments of the disclosed principles have been described above, it should be understood that they have been presented by way of example only, and not limitation. Thus, the breadth and scope of the invention(s) herein should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 137 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A multichip package, comprising:
    a master chip and one or more slave chips stacked with and electrically coupled to the master chip;
    an internal supply voltage generator located on the master chip and configured to generate an initial internal supply voltage to be sent to the one or more slave chips using chip interconnects; and
    a voltage regulator located on each of the master chip and at least one of the one or more slave chips, each voltage regulator configured to convert the initial internal supply voltage to a final internal supply voltage for use on each of the master chip and the at least one of the one or more slave chips.

2. A multichip package according to claim 1, wherein the voltage regulators on each of the master chip and at least one of the one or more slave chips are configured to step down the initial internal supply voltage to generate the final internal supply voltage.

3. A multichip package according to claim 2, wherein a minimum level of the initial internal supply voltage is determined by a resistance of the chip interconnects used to send the initial internal supply voltage to the one or more slave chips, as well as a maximum current consumption of the voltage regulators.

4. A multichip package according to claim 2, wherein the internal supply voltage generator comprises a charge pump circuit to generate the initial internal supply voltage.

5. A multichip package according to claim 2, wherein each of the voltage regulators comprises a voltage-down converter and a voltage driver.

6. A multichip package according to claim 1, wherein the master chip and the one or more slave chips comprise memory devices.

7. A multichip package according to claim 6, wherein the internal supply voltage generator is configured to generate an initial word line driver voltage, and the voltage regulators on each of the master chip and at least one of the one or more slave chips are word line driver voltage regulators configured to step down the initial word line driver voltage to generate a final word line driver voltage for use on each of the master chip and the at least one of the one or more slave chips.

8. A multichip package according to claim 7, wherein the initial word line driver voltage generator comprises a charge pump circuit to generate the initial word line driver voltage, and each of the word line driver voltage regulators comprises a voltage-down converter and a voltage driver.

9. A multichip package according to claim 6, wherein the internal supply voltage generator is configured to generate an initial data line voltage, and the voltage regulators on each of the master chip and at least one of the one or more slave chips are data line voltage regulators configured to convert the initial data line voltage to generate a final data line voltage for use on each of the master chip and the at least one of the one or more slave chips.

10. A multichip package according to claim 9, wherein the internal supply voltage generator comprises a division converter comprising a voltage divider and a negative feedback comparator for comparing a voltage from the voltage divider to a reference voltage.

11. A multichip package according to claim 9, wherein the data line voltage regulators comprise a negative feedback comparator for comparing the final data line voltage to the initial data line voltage.

12. A multichip package according to claim 6, further comprising a back bias voltage generator on the master chip, wherein the back bias voltage generator comprises a fast cycle oscillator circuit configured for active mode operation and a slow cycle oscillator circuit configured for standby mode operation.

13. A multichip package according to claim 12, further comprising a back bias voltage regulator on each of the master chip and at least one of the one or more slave chips, each back bias voltage regulator comprising a slow cycle oscillator configured for standby mode operation.

14. A multichip package according to claim 6, further comprising a bit line pre-charge voltage/cell plate voltage generator on each of the master chip and at least one of the one or more slave chips for generating a bit line pre-charge voltage/cell plate voltage.

15. A multichip package according to claim 6, wherein the internal supply voltage generator is configured to generate the initial internal supply voltage from a voltage external to the memory devices on the master chip.

16. A multichip package according to claim 15, wherein the external voltage is derived from input/output circuitry of the multichip package.

17. A multichip package according to claim 6, wherein the memory devices are DRAM memory devices.

18. A multichip package according to claim 1, wherein the one or more slave chips comprises a plurality of slave chips, a first of the plurality of slave chips stacked with the master chip, and others of the plurality of slave chips successively stacked with the first of the plurality of slave chips, the master chip and the plurality of slave chips electrically connected using the chip interconnects.

19. A multichip package according to claim 1, wherein the chip interconnects comprise through-silicon vias.

20. A method for voltage regulation, the method comprising:
providing a multichip package comprising a master chip and one or more slave chips;
generating an initial internal supply voltage on the master chip;
transmitting the initial internal supply voltage to at least one of the one or more slave chips stacked with and electrically coupled to the master chip using chip interconnects; and
converting the initial internal supply voltage on each of the master chip and the at least one of the one or more slave chips to a final internal supply voltage for use on each of the master chip and the at least one of the one or more slave chips.

21. A method according to claim 20, wherein converting the initial internal supply voltage comprises stepping down the initial internal supply voltage on each of the master chip and the at least one of the one or more slave chips to generate the final internal supply voltage.

22. A method according to claim 20, wherein generating the initial internal supply voltage further comprises generating a minimum level of the initial internal supply voltage based on a resistance of the chip interconnects used to send the initial internal supply voltage to the one or more slave chips, as well as a maximum current consumption of the voltage regulators.

23. A method according to claim 20, wherein providing the multichip package further comprises providing a multichip package comprising a master chip having memory devices and one or more slave chips having memory devices.

24. A method according to claim 23, wherein generating an initial internal supply voltage comprises generating an initial word line driver voltage, and wherein converting the initial internal supply voltage comprises stepping down the initial word line driver voltage on each of the master chip and the one or more slave chips to generate a final word line driver voltage for use on each of the master chip and the at least one of the one or more slave chips.

25. A method according to claim 24, wherein generating the initial word line driver voltage comprises generating the initial word line driver voltage using a charge pump circuit on the master chip, and wherein stepping down the initial word line driver voltage comprises stepping down the initial word line driver voltage with voltage regulators, each comprising a voltage-down converter and a voltage driver, on each of the master chip and the at least one of the one or more slave chips.

26. A method according to claim 23, wherein generating an initial internal supply voltage comprises generating an initial data line voltage, and wherein converting the initial internal supply voltage comprises converting the initial data line voltage to generate a final data line voltage for use on each of the master chip and the at least one of the one or more slave chips.

27. A method according to claim 26, wherein generating the initial data line voltage comprises generating the initial data line voltage using a division converter comprising a voltage divider and a negative feedback comparator for comparing a voltage from the voltage divider to a reference voltage, and wherein generating the final data line voltage comprises generating the final data line voltage using a negative feedback comparator for comparing the final data line voltage to the initial data line voltage.

28. A method according to claim 23, further comprising generating on the master chip a back bias voltage configured for active mode operation, and a back bias voltage for standby mode operation.

29. A method according to claim 28, further comprising generating a back bias voltage on at least one of the one or more slave chips for standby mode operation.

30. A method according to claim 23, further comprising generating a bit line pre-charge voltage/cell plate voltage on each of the master chip and at least one of the one or more slave chips.

31. A method according to claim 23, wherein generating the internal supply voltage comprises generating the initial internal supply voltage from a voltage external to the memory devices on the master chip.

32. A method according to claim 31, wherein the external voltage is derived from input/output circuitry of the multichip package.

33. A method according to claim 23, wherein providing the multichip package comprising a master chip having memory devices and one or more slave chips having memory devices further comprises providing a multichip package comprising a master chip having DRAM memory devices and one or more slave chips having DRAM memory devices.

34. A method according to claim 20, wherein providing the multichip package comprising one or more slave chips comprises providing a multichip package comprising a plurality of slave chips, a first of the plurality of slave chips stacked with the master chip, and others of the plurality of slave chips successively stacked with the first of the plurality of slave chips, the master chip and the plurality of slave chips electrically connected using the chip interconnects.

35. A method according to claim 20, wherein transmitting the initial internal supply voltage to at least one of the one or more slave chips using chip interconnects further comprises transmitting the initial internal supply voltage to the at least one of the one or more slave chips using through-silicon vias.

36. A multichip package, comprising:
a master chip comprising memory devices, and one or more slave chips comprising memory devices stacked with and electrically coupled to the master chip;
an initial word line driver voltage generator located on the master chip and configured to generate an initial word line driver voltage, and a word line driver voltage regulator located on each of the master chip and at least one of the one or more slave chips, each regulator configured to step down the initial word line driver voltage to generate a final word line driver voltage on each of the master chip and the at least one of the one or more slave chips; and
an initial data line voltage generator located on the master chip and configured to generate an initial data line voltage, and a data line voltage regulator located on each of the master chip and at least one of the one or more slave chips, each regulator configured to convert the initial data line voltage to a final data line voltage on each of the master chip and the at least one of the one or more slave chips.

37. A multichip package according to claim 36, wherein the initial word line driver voltage generator comprises a charge pump circuit to generate the initial word line driver voltage, and each of the word line driver voltage regulators comprises a voltage-down converter and a voltage driver.

38. A multichip package according to claim 36, wherein the initial data line voltage generator comprises a division converter comprising a voltage divider and a negative feedback comparator for comparing a voltage from the voltage divider to a reference voltage, and wherein the data line voltage regulators comprise a negative feedback comparator for comparing the final data line voltage to the initial data line voltage.

39. A multichip package according to claim 36, further comprising a back bias voltage generator located on the master chip and configured to generate a back bias voltage for active mode operation.

40. A multichip package according to claim 39, further comprising a back bias voltage regulator on each of the master chip and at least one of the one or more slave chips, each back bias voltage regulator comprising a slow cycle oscillator configured for standby mode operation.

41. A multichip package according to claim 36, further comprising a bit line pre-charge voltage/cell plate voltage generator on each of the master chip and at least one of the one or more slave chips for generating a bit line pre-charge voltage/cell plate voltage.

42. A multichip package according to claim 41, wherein the bit line pre-charge voltage/cell plate voltage is derived from the final data line voltage.

43. A multichip package according to claim 36, wherein the one or more slave chips comprises a plurality of slave chips, a first of the plurality of slave chips stacked with the master chip, and others of the plurality of slave chips successively stacked over the first of the plurality of slave chips, the master chip and the plurality of slave chips electrically connected using the chip interconnects.

44. A multichip package according to claim 36, wherein the initial word line driver voltage and the initial data line voltage are derived from a voltage external to the memory devices on the master chip.

45. A multichip package according to claim 44, wherein the external voltage is derived from input/output circuitry of the multichip package.

46. A multichip package according to claim 36, wherein the memory devices are DRAM memory devices.

47. A multichip package according to claim 36, wherein the chip interconnects comprise through-silicon vias.

48. A method for voltage regulation, the method comprising:
providing a multichip package comprising a master chip having memory devices and one or more slave chips having memory devices;
generating an initial word line driver voltage on the master chip;
transmitting the initial word line driver voltage to at least one of the one or more slave chips using chip interconnects, the one or more slave chips stacked with and electrically coupled to the master chip;
stepping down the initial word line driver voltage on each of the master chip and the at least one of the one or more slave chips to generate a final word line driver voltage for use on each of the master chip and the at least one of the one or more slave chips;
generating an initial data line voltage on the master chip;
transmitting the initial data line voltage to at least one of the one or more slave chips using the chip interconnects; and
converting the initial data line voltage on each of the master chip and the at least one of the one or more slave chips to generate a final data line voltage on each of the master chip and the at least one of the one or more slave chips.

49. A method according to claim 48, wherein generating the initial word line driver voltage comprises generating the initial word line driver voltage from a voltage external to the memory devices on the master chip.

50. A method according to claim 48, wherein generating the initial word line driver voltage comprises generating the initial word line driver voltage using a charge pump circuit on the master chip, and wherein stepping down the initial word line driver voltage comprises stepping down the initial word line driver voltage with voltage regulators, each comprising a voltage-down converter and a voltage driver, on each of the master chip and chip one or more slave chips.

51. A method according to claim 48, wherein generating the initial data line voltage comprises generating the initial data line voltage from a voltage external to the memory devices on the master chip.

52. A method according to claim 48, wherein generating the initial data line voltage comprises generating the initial data line voltage using a division converter comprising a voltage divider and a negative feedback comparator for comparing a voltage from the voltage divider to a reference voltage.

53. A method according to claim 48, further comprising generating on the master chip a back bias voltage configured for active mode operation of the multichip package and a back bias voltage for standby mode operation of the multichip package.

54. A method according to claim 48, further comprising generating a back bias voltage on each of the one or more slave chips for standby mode operation of the multichip package.

55. A method according to claim 48, further comprising generating a bit line pre-charge voltage/cell plate voltage on each of the master chip and at least one of the one or more slave chips.

56. A method according to claim 55, wherein generating the bit line pre-charge voltage/cell plate voltage on each of the master chip and at least one of the one or more slave chips comprises deriving the bit line pre-charge voltage/cell plate voltage from the final data line voltage.

57. A method according to claim 48, wherein the memory devices are DRAM memory devices.

58. A method according to claim 48, wherein providing the multichip package comprising one or more slave chips comprises providing a multichip package comprising a plurality of slave chips, a first of the plurality of slave chip stacked with the master chip, and others of the plurality of slave chips successively stacked with the first of the plurality of slave chips, the master chip and plurality of slave chips electrically connected using the chip interconnects.

59. A method according to claim 48, wherein transmitting the initial internal supply voltage to at least one of the one or more slave chips using chip interconnects further comprises transmitting the initial internal supply voltage to the at least one of the one or more slave chips using through-silicon vias.

* * * * *